(12) United States Patent
Lung et al.

(10) Patent No.: US 8,437,192 B2
(45) Date of Patent: May 7, 2013

(54) 3D TWO BIT-PER-CELL NAND FLASH MEMORY

(75) Inventors: Hsiang-Lan Lung, Dobbs Ferry, NY (US); Hang-Ting Lue, Hsinchu (TW); Yen-Hao Shih, Elmsford, NY (US); Erh-Kun Lai, Elmsford, NY (US); Ming-Hsiu Lee, Hsinchu (TW); Tien-Yen Wang, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 271 days.

(21) Appl. No.: 12/785,291

(22) Filed: May 21, 2010

(65) Prior Publication Data

US 2011/0286283 A1 Nov. 24, 2011

(51) Int. Cl.
- G11C 16/00 (2006.01)
- G11C 16/02 (2006.01)
- G11C 16/04 (2006.01)
- G11C 5/02 (2006.01)
- G11C 5/06 (2006.01)

(52) U.S. Cl.
USPC ........... 365/185.17; 365/185.05; 365/51; 365/63; 365/72

(58) Field of Classification Search ........ 365/185.05, 365/185.17, 51, 63, 72; 257/E21.409
See application file for complete search history.

(56) References Cited

U.S. PATENT DOCUMENTS

| | | | |
|---|---|---|---|
| 6,034,882 A | 3/2000 | Johnson et al. | |
| 6,906,361 B2 | 6/2005 | Zhang | |
| 6,906,940 B1 | 6/2005 | Lue | |
| 7,081,377 B2 | 7/2006 | Cleeves | |
| 7,129,538 B2 | 10/2006 | Lee et al. | |
| 7,177,169 B2 | 2/2007 | Scheuerlein | |
| 7,274,594 B2 | 9/2007 | Pascucci et al. | |
| 7,315,474 B2 | 1/2008 | Lue et al. | |
| 7,382,647 B1 | 6/2008 | Gopalakrishnan | |
| 7,420,242 B2 | 9/2008 | Lung | |
| 2005/0133860 A1* | 6/2005 | Forbes | 257/330 |
| 2005/0280061 A1 | 12/2005 | Lee | |
| 2007/0140001 A1 | 6/2007 | Motoi et al. | |

(Continued)

FOREIGN PATENT DOCUMENTS

| | | |
|---|---|---|
| EP | 1936681 A1 | 6/2008 |
| EP | 2048709 A2 | 4/2009 |

OTHER PUBLICATIONS

Choi et al., "Performance Breakthrough in NOR Flash Memory with Dopant-Segregated Schottky-Barrier (DSSB) SONOS Device", 2009 Symposium on VLSI Technology Digest of Technical Papers, Jun. 16-18, 2009, pp. 1-2.

(Continued)

*Primary Examiner* — John J. H. Hur
(74) *Attorney, Agent, or Firm* — Haynes Beffel & Wolfeld LLP

(57) ABSTRACT

A 3D memory device includes bottom and top memory cubes having respective arrays of vertical NAND string structures. A common source plane comprising a layer of conductive material is between the top and bottom memory cubes. The source plane is supplied a bias voltage such as ground, and is selectively coupled to an end of the vertical NAND string structures of the bottom and top memory cubes. Memory cells in a particular memory cube are read using current through the particular vertical NAND string between the source plane and a corresponding bit line coupled to another end of the particular vertical NAND string.

13 Claims, 20 Drawing Sheets

U.S. PATENT DOCUMENTS

| | | | |
|---|---|---|---|
| 2007/0158736 A1* | 7/2007 | Arai et al. | 257/315 |
| 2008/0096327 A1 | 4/2008 | Lee et al. | |
| 2008/0101109 A1 | 5/2008 | Haring-Bolivar et al. | |
| 2008/0180994 A1 | 7/2008 | Katsumata et al. | |
| 2008/0242034 A1* | 10/2008 | Mokhlesi et al. | 438/287 |
| 2008/0247230 A1 | 10/2008 | Lee et al. | |
| 2009/0097321 A1 | 4/2009 | Kim et al. | |
| 2009/0184360 A1 | 7/2009 | Jin et al. | |
| 2010/0020617 A1* | 1/2010 | Oh et al. | 365/185.23 |

OTHER PUBLICATIONS

Lai et al., "A Multi-Layer Stackable Thin-Film Transistor (TFT) NAND-Type Flash Memory", IEEE Int'l Electron Devices Meeting, Dec. 11-13, 2006.

Jung et al., "Three Dimensionally Stacked NAND Flash Memory Technology Using Stacking Single Crystal Si Layers on ILD and TANOS Structure for Beyond 30nm Node", IEEE Int'l Electron Devices Meeting, Dec. 11-13, 2006.

Johnson et al., "512-Mb PROM With a Three-Dimensional Array of Diode/Anti-fuse Memory Cells" IEEE J. of Solid-State Circuits, vol. 38, No. 11, Nov. 2003.

Tanaka et al., "Bit Cost Scalable Technology with Punch and Plug Process for Ultra High Density Flash Memory", 2007 Symposium on VLSI Technology Digest of Technical Papers; Jun. 12-14, 2007, pp. 14-15.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Jang et al., "Vertical Cell Array Using TCAP (Terabit Cell Array Transistor) Technology for Ultra High Density NAND Flash Memory," 2009 Symposium on VLSI Technology Digest of Technical Papers, Jun. 16-18, 2009, pp. 192-193.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Paul et al., "Impact of a Process Variation on Nanowire and Nanotube Device Performance," 2007 IEEE, Jun. 18-20, 2007, pp. 2369-2376.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lai et al., "Highly Reliable MA BE-SONOS (Metal-AI2 O3 Bandgap Engineered SONOS) Using a SiO2 Buffer Layer," VLSI Technology, Systems and Applications, 2008, VLSI-TSA 2008 International Symposium on Apr. 21-23, 2008, pp. 58-59.

U.S. Appl. No. 12/430,290, filed Apr. 27, 2009 entitled Integrated Circuit 3D Memory Array and Manufacturing Methods by inventors Hsiang-Ian Lung and Hang-Ting Lue, consisting of 44 pages.

* cited by examiner

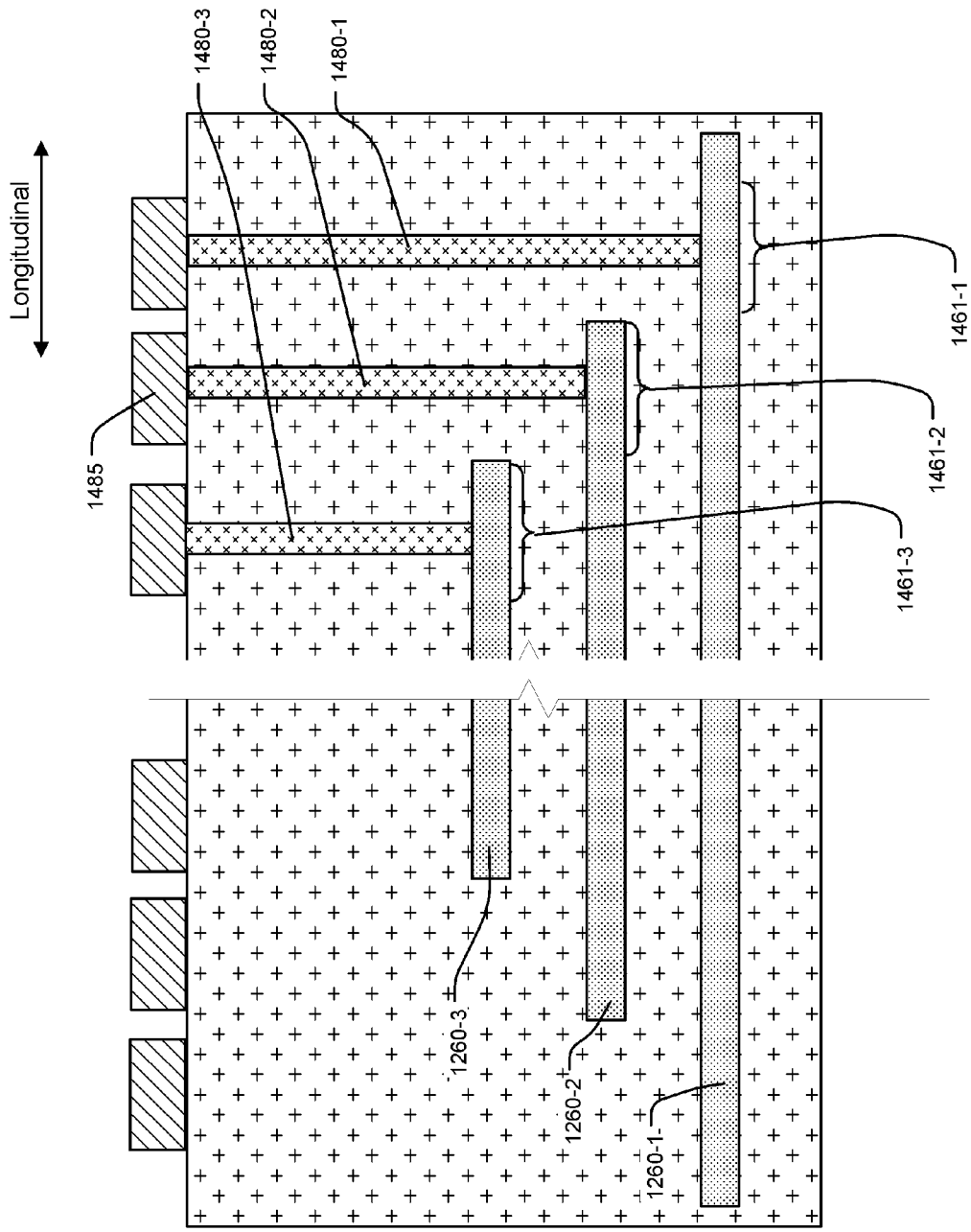

3D TWO BIT-PER-CELL NAND FLASH MEMORY

BACKGROUND OF THE INVENTION

1. Field of the Invention

The present invention relates to high density memory devices, and particularly to memory devices in which multiple planes of memory cells are arranged to provide a three-dimensional 3D array.

2. Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit. For example, thin film transistor techniques are applied to charge trapping memory technologies in Lai, et al., "A Multi-Layer Stackable Thin-Film Transistor (TFT) NAND-Type Flash Memory", IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node", IEEE Int'l Electron Devices Meeting, 11-13 Dec. 2006.

Another structure that provides vertical NAND cells in a charge trapping memory technology is described in Tanaka et al., "Bit Cost Scalable Technology with Punch and Plug Process for Ultra High Density Flash Memory", 2007 Symposium on VLSI Technology Digest of Technical Papers; 12-14 Jun. 2007, pages: 14-15. Also, Jin et al., U.S. Patent Application Publication No. US 2009/0184360, describe a vertical NAND string structure using SONOS charge storage technology to implement data storage cites on two sides of each vertical channel structure.

However, there is a limit on the number of layers of cells that can be implemented using vertical NAND string structures, which is imposed by the impedance of the vertical string of cells in each NAND string. Thus, the number of layers that can be practically implemented in this structure is relatively small.

As the need for higher and higher memory capacity in integrated circuit memory devices continues to increase, it is desirable to provide a structure for three-dimensional integrated circuit memory with a low manufacturing cost, including reliable, very small memory elements that can be erased and programmed.

SUMMARY OF THE INVENTION

A memory device comprises a plurality of bit lines over a substrate; a plurality of memory cells over the plurality of bit lines, wherein at least one memory cell of the plurality of memory cells is over another one memory cell of the plurality of memory cells; and a source plane over the plurality of memory cells. This structure is suitable for use in forming a memory device that includes a first set of select transistors; a first 3D array of memory cells coupled to the first set of select transistors; a common source coupled to the first 3D array of memory cells; a second 3D array of memory cells coupled to the common source, wherein the common source is between the first and second 3D array of memory cells; and a second set of select transistors coupled to the second 3D array of memory cells.

A 3D memory device is described which includes bottom and top memory cubes having respective arrays of vertical NAND string structures. A common source plane comprising a layer of conductive material is between the top and bottom memory cubes. The source plane is supplied a bias voltage such as ground, and is selectively coupled to an end of the vertical NAND string structures of the bottom and top memory cubes. Memory cells in a particular memory cube are read using current through the particular vertical NAND string between the source plane and a corresponding bit line coupled to another end of the particular vertical NAND string. The vertical NAND strings in the bottom and top memory cubes provide a large number of stackable layers of cells, resulting a high density NAND architecture flash memory device which overcomes the prior art limitation on the number of stackable layers of cells imposed by the impedance of a vertical string of cells of a single NAND string.

A 3D array of memory cells described herein includes bottom and top memory cubes including respective arrays of semiconductor pillars. A given semiconductor pillar in each array of semiconductor pillars includes a plurality of dielectric charge trapping structures in a NAND string along a side of the given semiconductor pillar. Word lines are orthogonal to the semiconductor pillars and adjacent the charge trapping structures of the semiconductor pillars. A source plane is between the bottom and top memory cubes. The source plane is selectively coupled to top ends of each of the semiconductor pillars of the bottom memory cube by a bottom set of source plane select transistors, and selectively coupled to bottom ends of each of the semiconductor pillars of the top memory cube by a top set of source plane select transistors. The 3D array further includes a bottom set of pillar select transistors to selectively couple bottom ends of the semiconductor pillars of the bottom memory cube to corresponding bit lines in a plurality of bottom bit lines. A top set of pillar select transistors selectively couple top ends of the semiconductor pillars of the top memory cube to corresponding bit lines in a plurality of top bit lines.

Memory cubes described herein are based on a plurality of two-cell unit structures. The two-cell unit structures of a given semiconductor pillar include a first or left dielectric charge trapping structure along a first side of the given semiconductor pillar, a second or right dielectric charge trapping structure along a second side of the given semiconductor pillar. The first charge trapping structures in the two-cell unit structures of the given semiconductor pillar are arranged in a first NAND string, and the second charge trapping structures in the two-cell unit structures of the given semiconductor pillar are arranged in a second NAND string. Multiple levels of cells are implemented on the array of semiconductor pillars using word line structures on each level, so that cells are formed at the cross-points of the sides of the semiconductor pillars and word line structures in each level, with dielectric charge trapping structures in between, providing the 3D array of memory cells. Examples of the dielectric charge trapping structures include SONOS-type ONO structures and BE-SONOS-type ONONO structure.

The word line structures include a first set of word lines, coupled in common to a first driver on for example the left side of the structure, arranged adjacent the dielectric charge trapping structures between alternating pairs of rows of semiconductor pillars, and a second set of word lines interleaved with the first set, and coupled in common to a second driver on for example the right side of the structure, arranged adjacent the dielectric charge trapping structures between interleaved alternating pairs of rows of semiconductor pillars. This results in word lines that provide gates adjacent the dielectric charge trapping structures on the first and second sides of the semiconductor pillars, and thereby provides two independently addressable memory cells in each level on each semiconductor pillar. A controller is coupled to the array, and arranged to program and erase selected memory cells two-cell unit structures by biasing corresponding semiconductor pillars and one of the first or second sets of word lines to induce gate side Fowler-Nordheim (FN) programming and gate side Fowler-Nordheim erasing operations.

Methods for manufacturing a 3D array of memory cells including bottom and top memory cubes and a source plane between them as described herein require few lithographic steps, and are therefore practical and low-cost compared to other 3D memory processes.

Other aspects and advantages of the present invention can be seen on review of the drawings, the detailed description and the claims, which follow.

BRIEF DESCRIPTION OF THE DRAWINGS

FIGS. 12, 13, 14 and 15A-15C illustrate 3D interconnect structures for coupling the word line levels to decoding circuitry.

DETAILED DESCRIPTION

A detailed description of embodiments of the present invention is provided with reference to the FIGS. 1-19.

Figure 1:
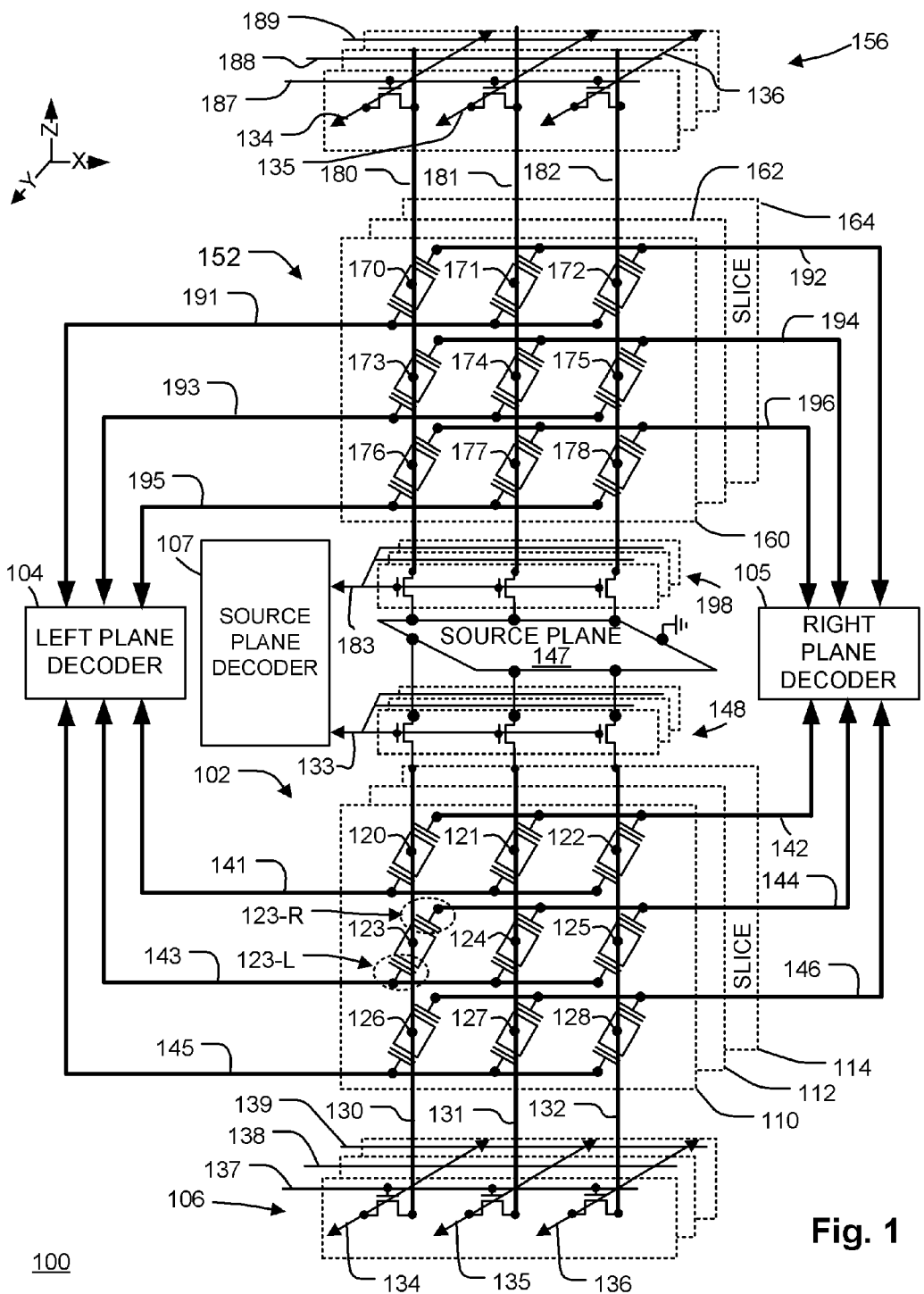
FIG. 1 is a schematic diagram of a 3D memory device including a common source plane arranged between a bottom memory cube of memory cells and a top memory cube of memory cells.

FIG. 1 is a schematic diagram of a 3D memory device 100 including a common source plane 147 arranged between a bottom memory cube 102 of memory cells and a top memory cube 152 of memory cells.

The schematic diagram of FIG. 1 shows "slices" 110, 112, 114 which lie in X-Z planes of the bottom memory cube 102. In the illustrated schematic, there are nine two-cell unit structures 120-128 in slice 110, each two-cell unit structure 120-128 having two memory cells including having separate charge storage structures and left and right gates. Embodiments can include many two-cell unit structures per slice.

The bottom memory cube 102 includes an array of memory cells arranged for NAND-type decoding, using a left plane decoder 104, right plane decoder 105, a bottom set of pillar select transistors 106, and source plane decoder 107. The left and right side memory cells of the two-cell unit structures 120-128 in a Z-direction column (e.g. 120, 123, 126) are arranged in left and right NAND strings respectively. More details of the two-cell unit structure and the NAND strings are provided below.

Bottom ends of the array of semiconductor pillars of the two-cell unit structures 120-128 in a Z-direction column (e.g. 120, 123, 126) are coupled via a corresponding semiconductor pillar 130, 131, 132 to a corresponding access device in the bottom set of pillar select transistors 106, implemented for example in the integrated circuit substrate beneath the structure.

The access devices in the bottom set of pillar select transistors 106 selectively couple a Z-direction column of the two-cell unit structures 120-128 to a corresponding bit line in a plurality of bit lines 134, 135, 136 extending in the Y-direction. The plurality of bit lines 134, 135, 136 are coupled to a column decoder (not shown).

The gates of the bottom set of pillar select transistors 106 are coupled to select lines 137, 138, 139 extending in the X-direction. The select lines 137, 138, 139 are coupled to a row decoder (not shown).

The left gates on the two-cell unit structures in a particular level (e.g. two unit-cell structures 120, 121, 122) in all of the slices 110, 112, 114 are coupled via a word line element 141 to a driver selected by left plane decoder 104. Likewise, the right gates on the two-cell unit structures in a particular level (e.g. 120, 121, 122) in all of the slices 110, 112, 114 are coupled via word line element 142. The left gates and right gates on the level including two-cell unit structures 123, 124, 125 are coupled via the word line element 143 to the left plane decoder 104 and via word line element 144 to the right plane decoder 105. The left and right gates on the level including two-cell unit structures 126, 127, 128 are coupled via the word line element 145 to the left plane decoder 104 and via word line element 146 to the right plane decoder 105.

Top ends of the array of semiconductor pillars of the two-cell unit structures 120-128 in a Z-direction column (e.g. 120, 123, 126) are coupled via a corresponding select transistor in a bottom set of source plane select transistors 148 to the source plane 147. The source plane 147 is a layer of conductive material between the bottom and top memory cubes 102, 152. In the illustrated example, the source plane 147 is coupled to a ground terminal. Alternatively, the source plane 147 may be coupled to a voltage source other than ground.

Common conductive plane 133, acting as the gate of each of the access devices in the bottom set of source plane select transistors 148, is coupled to a driver selected by source plane decoder 107.

The top memory cube 152 overlies and is selectively coupled to the source plane 147 by a top set of source plane select transistors 198. The arrangement of the memory cells in the top memory cube 152 is similar to that of the bottom memory cube 102. The top memory cube 152 includes "slices" 160, 162, 164 which lie in the X-Z planes of the top memory cube 152. In the illustrated schematic, there are nine two-cell unit structures 170-178 in slice 160, each unit structure 170-178 having two memory cells including having separate charge storage structures and left and right gates. Embodiments can include many two-cell structures per slice.

The memory cells in the top memory cube 152 are arranged for NAND-type decoding, using the left plane decoder 104, right plane decoder 105, the top set of pillar select transistors 156, and source plane decoder 107. As discussed in more detail below, the left and right side memory cells of the two-unit cell structures 170-178 in a Z-direction column (e.g. 170, 173, 176) are arranged in left and right NAND strings respectively.

Top ends of the semiconductor pillars of the two-cell unit structures 170-178 in a Z-direction column (e.g. 170, 173, 176) are coupled via a corresponding semiconductor pillar 180, 181, 182 to a corresponding access device in the top set of pillar select transistors 156, implemented for example in the integrated circuit above the top memory cube 152.

The access devices in the top set of pillar select transistors 156 selectively couple the semiconductor pillars of the two-cell unit structures 170-178 to a corresponding bit line in a plurality of bit lines 184, 185, 186 extending in the Y-direction and coupled to the column decoder (not shown).

The gates of the top set of pillar select transistors 156 are coupled to select lines 187, 188, 189 extending in the X-direction. The select lines 187, 188, 189 are coupled to a row decoder (not shown).

The left gates on the two-cell unit structures in a particular level (e.g. 170, 171, 172) in all of the slices 160, 162, 164 are coupled via a word line element 191, 193, 195 to the left plane decoder 104. Likewise, the right gates on the two-cell unit structures in a particular level (e.g. 170, 171, 172) in all of the slices 160, 162, 164 are coupled to the right plane decoder 105 via word line element 192, 194, 196.

Bottom ends of the semiconductor pillars of the two-cell unit structures 120-128 in a Z-direction column (e.g. 120, 123, 126) are coupled via a corresponding select transistor in the top set of source plane select transistors 198 to the source plane 147.

Common conductive plane 183, acting as the gate of each of the access devices in the bottom set of source plane select transistors 148, is coupled to a driver selected by source plane decoder 107.

The two-cell unit structure 123 in the bottom memory cube 102 is representative of the two-cell unit structures in the 3D memory device 100. The two-cell unit structure includes a left side memory cell 123-L and a right side memory cell 123-R.

In a read operation of a selected one of the left and right side memory cells 123-L, 123-R, a current path is established between the bit line 134 and the source plane 147 via the particular NAND string to which the selected memory cell belongs.

For example, in a read operation of the left side memory cell 123-L, voltages are applied to the word line elements 141 and 145 sufficient to turn on the left side memory cells of the two-cell unit structures 120 and 126. An X-direction row on the select line 137 is selected using a row (X) decoder (not shown), and a Y-direction column on the bit line 134 using a column (Y) decoder (not shown). Voltages are applied to the common conductive planes 133 and 183 using the source plane decoder 107 to turn on the bottom set of source plane select transistors 148, and turn off the top set of source plane select transistors 198 respectively. As a result the source plane 147 is coupled to the top ends of the array of semiconductor pillars of the bottom memory cube 102.

A read voltage is applied to the word line element 143 coupled to the left side memory cell 123-L in the unit-cell structure 123. The current on the bit line 134 and through the left NAND string of the left side memory cells of the two-unit cell structures 120, 123, 126 indicates the data value stored in the left side memory cell 123-L in the unit-cell structure 123.

Three-dimensional stacking as described herein using top and bottom memory cubes 152, 102 and the source plane 147 between them is an efficient way to reduce the cost per bit for semiconductor memory by providing a large number of stackable layers of cells, which overcome the limitation imposed by the impedance of a vertical string of cells in a given NAND string.

Two memory cubes 102, 152 are illustrated in FIG. 1. The 3D memory device 100 can also include more than two memory cubes. For example, the structure of a pair of memory cubes separated by a source plane can be repeated a number of times along the Z-direction. In some embodiments, such as explained below with reference to FIG. 19, an additional memory cube overlying the top memory cube 162 shares the top set of pillar select transistors 156 with the top memory cube 152, including the bit lines 134, 135, 136 and select lines 187, 188, 189.

Figure 2:
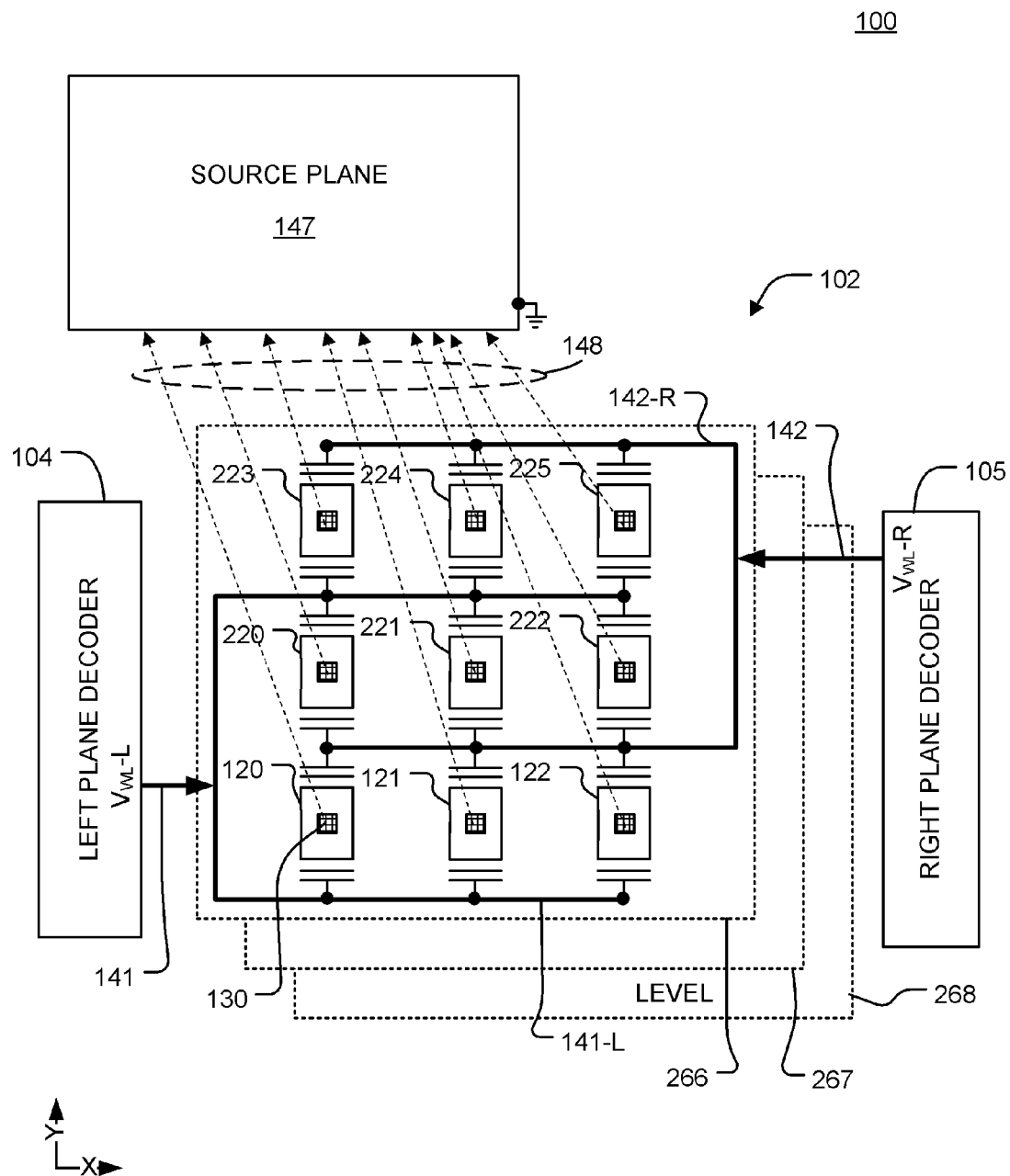
FIG. 2 is a schematic diagrams of the 3D memory device, showing levels which lie in the X-Y planes of the bottom memory cube.

FIG. 2 is a schematic diagram of the 3D memory device 100, showing "levels" 266, 267, 268 which lie in the X-Y planes of the bottom memory cube 102. The levels 266, 267, 268 lie in the X-Y planes, and thus are perpendicular to the "slices" (See, FIG. 1, reference numerals 110,112,114) which lie in the X-Z planes. The left and right plane decoders 104, 105 and the source plane 147 are illustrated in the figure. Each level in the schematic includes nine two-cell unit structures. Embodiments can include many cells per level. The front row of two-unit structures in level 266 includes two-unit cell structures 120, 121 and 122, corresponding to the top row in the slice 110 shown in FIG. 1. The two-cell unit structures 120-122 and 220-225 define a 3-by-3, X-Y arrangement of unit structures on the level 266. As shown in FIG. 2, the left word line element 141 is arranged to connect to the left side gates between alternating pairs of rows using a forked word line element 141-L. Likewise, the right word line element 142 is interleaved with the left word line element 141, and arranged to connect to the right side gates between other alternating pairs of rows using forked word line element 142-R. As described below, the left and right side word lines may be separated from one another in each level, and connected by vias to overlying conductors (rather than forked and connected together in each level as shown).

Figure 3:
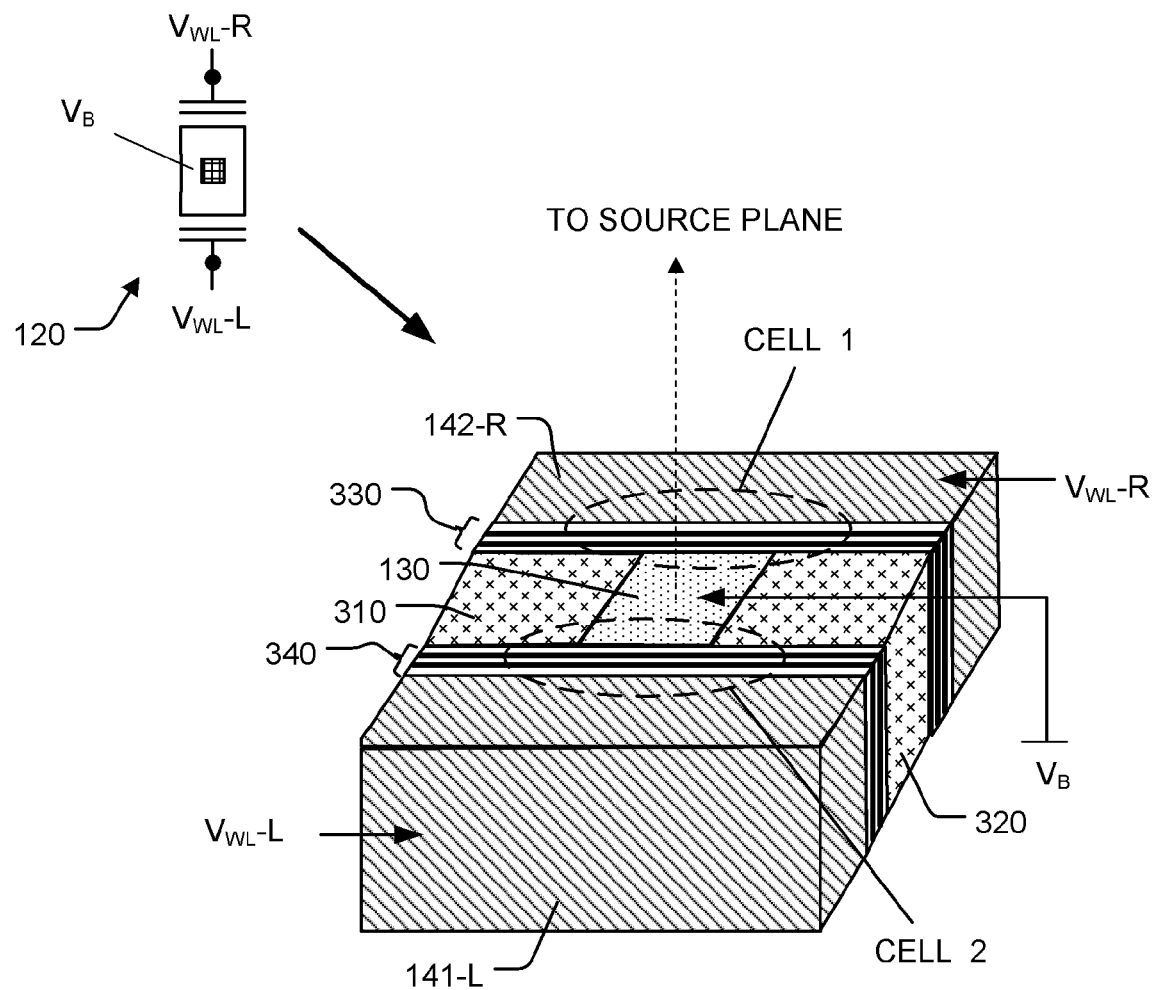
FIG. 3 shows the structure of a 2-bit unit cell.

The two-cell unit structure is shown in FIG. 3. Reference number 120 which is utilized in FIG. 1 and FIG. 2 representing the unit structure can be represented by the structure shown, including word line element 141-L, word line element 142-R, and the semiconductor pillar 130. Dielectric insulators 310, 320 separate the pillars. Dielectric charge trapping structures 330, 340 lie on opposing sides of the semiconductor pillar 130 and the corresponding gates provided by the word line elements, 142-R or 141-L. Thus, two memory cells are provided by this structure, including CELL 1 and CELL 2 as labeled in the drawing, each cell including a charge trapping element and a gate.

The charge trapping structures 330, 340 include a tunneling layer in contact with the word line material, the charge trapping layer over the tunneling layer, and a blocking layer over the charge trapping layer, such as used in typical charge trapping memory devices. For example, the tunneling layer may comprise a layer of silicon dioxide or silicon oxide nitride, a charge trapping layer may comprise a layer of silicon nitride or other charge trapping material, and the blocking layer may comprise a layer of silicon dioxide or a high-k material typical in SONOS type memory device. In alternatives, as explained below with reference to FIG. 16, a bandgap engineered charge trapping structure can be utilized.

Bias voltages applied to the unit structures include the right word line voltage $V_{WL-R}$, the left word line voltage $V_{WL-L}$, and the pillar voltage $V_B$. Self boosting caused by capacitive coupling of voltages from word lines of unselected, floating semiconductor pillars helps prevent program disturb conditions. The voltages applied depend upon the operation to be performed (e.g. read, program, and erase), and will vary from embodiment to embodiment. The read, program and erase operations of a selected memory cell in the two-unit cell structure are discussed in more detail below.

Figure 4:
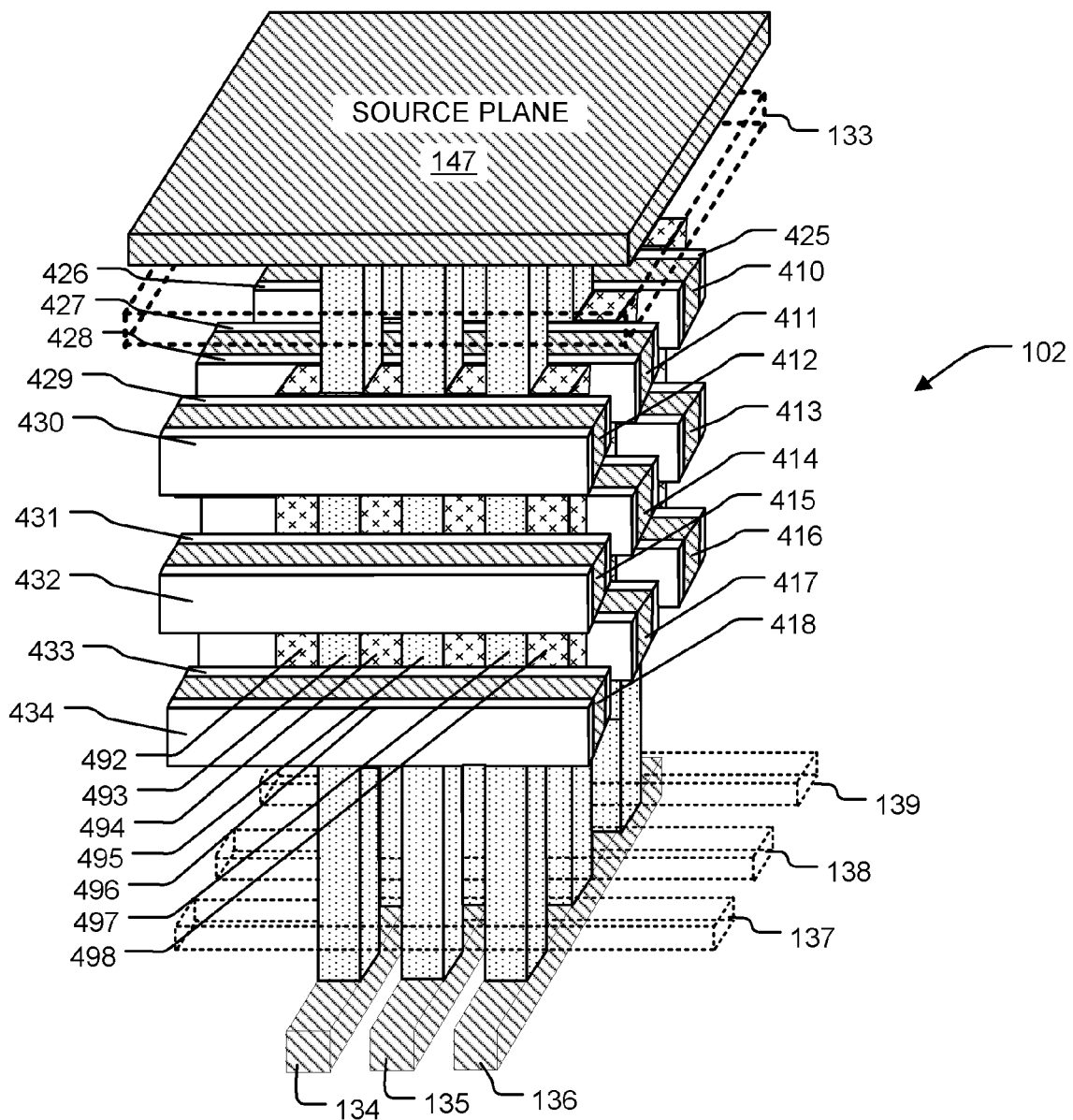
FIG. 4 is a perspective drawing of a portion of a 3D memory device described herein.

FIG. 4 shows a portion of the 3D memory device 100 including the bottom memory cube 102 of memory cells, common conductive plane 133 for the bottom set of source plane select transistors 148, the source plane 147, and bit lines 134, 135, 136 and select lines 137, 138, 139 for the bottom set of pillar select transistors 106 as described above with reference to FIGS. 1-3. Three levels of word lines are illustrated, where a top level includes word lines 410, 411 and 412 extending in the X-direction, a next lower level includes word lines 413, 414 and 415, and a bottom level includes word lines 416, 417 and 418. Charge storage structures 425-430 are formed on opposing sides of the word lines 410-412 on the top level. Charge storage structures 431-432 are formed on opposing sides of word line 415, and charge storage structures 433-434 are formed on opposing sides of word line 418. Similar charge storage structures are formed on the sides of the other word lines in the structure as well. The structure includes an array of semiconductor pillars, including pillars 493, 495, and 497 in the front of the structure shown. Between and on opposing sides of the semiconductor pillars, insulating pillars are formed. Thus, insulating pillars 492, 494, 496 and 498 are shown on opposing sides of the semiconductor pillars 493, 495, and 497.

The select lines 137, 138, 139, acting as gates for select transistors, underlie the bottom memory cube 102 and extend in the X-direction. The semiconductor pillars extend through the select lines 137, 138 and 139 to the bit lines 134, 135 and 136 extending in the Y-direction.

Common conductive plane 133, acting as gates for each of the bottom set of source plane select transistors 148, overlies the bottom memory cube 102. The semiconductor pillars extend through the common conductive plane 133 to the source plane 147.

Thus, FIG. 4 shows a memory device that comprises a plurality of bit lines 134, 135, 136 over a substrate. A plurality of memory cells is formed at the cross points of the semiconductor pillars 493, 495, 497 and the charge storage structures 425-430 on the opposing sides of the word lines (e.g. 410-412), and lies over the plurality of bit lines. In this structure at least one memory cell of the plurality of memory cells is over another one memory cell of the plurality of memory cells, such as by being on the same semiconductor pillar as a lower cell. A source plane 147 is over the plurality of memory cells. This structure is suitable for use in forming a memory device that includes a first set of select transistors; a first 3D array of memory cells coupled to the first set of select transistors; a common source coupled to the first 3D array of memory cells; a second 3D array of memory cells coupled to the common source, wherein the common source is between the first and second 3D array of memory cells; and a second set of select transistors coupled to the second 3D array of memory cells, like that shown in FIG. 1. Alternatively, this structure can be used as a top memory cube in a memory device including a top and a bottom memory cube, and in which the plurality of bit lines is shared between the top and bottom memory cubes.

Figure 5:
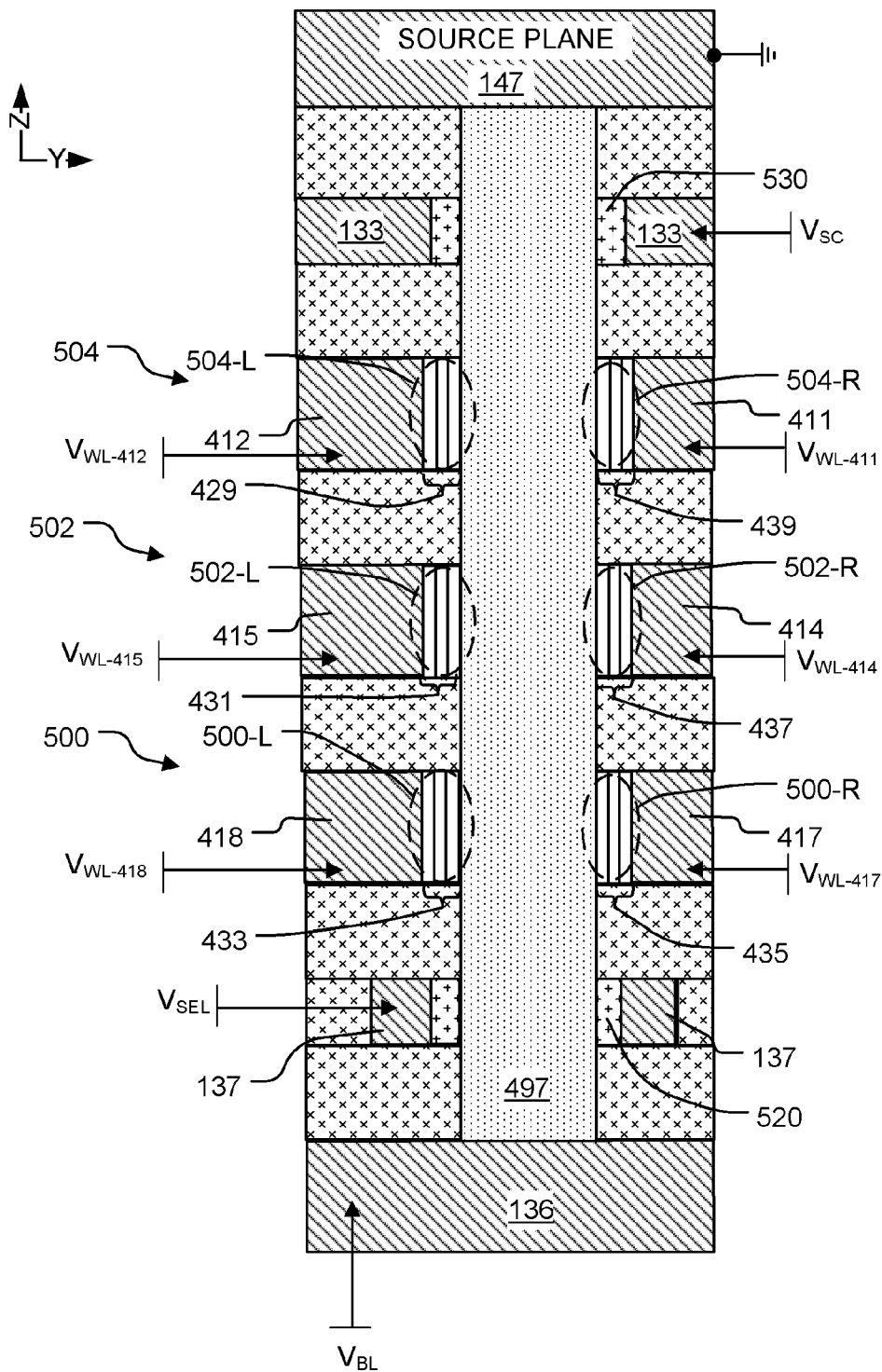
FIG. 5 is a cross-sectional view in the Y-Z plane of the structure in FIG. 4.

FIG. 5 is a cross-sectional view in the Y-Z plane of the structure in FIG. 4 showing the two-cell unit structures 500, 502, 504 along a Z-direction column which includes the semiconductor pillar 497. The reference numerals in FIG. 4 are repeated in FIG. 5 where appropriate.

The two-cell unit structure 500 includes a left cell 500-L and a right cell 500-R. The left cell 500-L includes word line 418 as the gate and the charge storage structure 433 as the charge storage element. The right cell 500-L includes word line 417 as the gate and the charge storage structure 435 as the charge storage element.

The two-cell unit structure 502 includes a left cell 502-L and a right cell 502-R. The left cell 502-L includes word line 415 as the gate and the charge storage structure 431 as the charge storage element. The right cell 502-L includes word line 414 as the gate and the charge storage structure 437 as the charge storage element.

The two-cell unit structure 504 includes a left cell 504-L and a right cell 504-R. The left cell 504-L includes word line 412 as the gate and the charge storage structure 429 as the charge storage element. The right cell 504-L includes word line 411 as the gate and the charge storage structure 439 as the charge storage element.

Each of the levels of word lines are separated by insulating material, such as silicon nitride or silicon dioxide. Thus, two Z-direction NAND strings are provided by the two-cell unit structures 500, 502, 504. A left NAND string includes the left cells 500-L, 502-L, and 504-L. A right NAND includes the right cells 500-R, 502-R, and 504-R.

The select line 137 surrounds the semiconductor pillar 497, and extends into and out of the cross-section illustrated in FIG. 5. Gate dielectric 520 separates the select line 137 from the semiconductor pillar 497. The common conductive plane 133 is separated from the semiconductor pillar 497 by gate dielectric 530.

Bias voltages applied to the structures include right word line voltages $V_{WL}$ applied to the word lines 411, 414 and 417, left word line voltages $V_{WL}$ applied to the word lines 412, 415, and 418, select line voltage $V_{SEL}$ applied to the select line 137, bit line voltage $V_{BL}$ applied to the bit line 136, source control voltage $V_{SC}$ applied to the common conductive plane 133, and source plane voltage $V_{SP}$ applied to the source plane 147. In the illustrated example the source plane is coupled to a ground terminal, so the source plane voltage $V_{SP}$ is 0 Volts. Alternatively, voltages other than ground can be used for the source plane voltage $V_{SP}$.

The following table shows representative operating voltages for a read operation of the left memory cell 502-L, and for a read operation of the right memory cell 502-R. Of course, the voltage levels will vary from embodiment to embodiment.

| Example Operating Voltages for Read Operation | | |
| --- | --- | --- |
| | Read Cell 502-L | Read Cell 502-R |
| $V_{WL\text{-}412}$ | 5 V | floating |
| $V_{WL\text{-}415}$ | 2 V | floating |
| $V_{WL\text{-}418}$ | 5 V | floating |
| $V_{WL\text{-}411}$ | floating | 5 V |
| $V_{WL\text{-}414}$ | floating | 2 V |
| $V_{WL\text{-}417}$ | floating | 5 V |
| $V_{SEL}$ | 3 V | 3 V |
| $V_{SC}$ | 3 V | 3 V |
| $V_{SP}$ | 0 V | 0 V |
| $V_{BL}$ | 1 V | 1 V |

The following table shows representative operating voltages for a gate injection program via +FN programming of the left memory cell 502-L, and for programming of the right memory cell 502-R. Of course, the voltage levels will be adjusted as suits a particular implementation and programming method, and thus will vary from embodiment to embodiment.

Example Operating Voltages for Program Operation

|  | Prog Cell 502-L | Prog Cell 502-R |
|---|---|---|
| $V_{WL-412}$ | floating | floating |
| $V_{WL-415}$ | +10 V | +20 V |
| $V_{WL-418}$ | floating | floating |
| $V_{WL-411}$ | floating | floating |
| $V_{WL-414}$ | +20 V | +10 V |
| $V_{WL-417}$ | floating | floating |
| $V_{SEL}$ | 5 V | 5 V |
| $V_{SC}$ | 0 V | 0 V |
| $V_{SP}$ | 0 V | 0 V |
| $V_{BL}$ | 0 V | 0 V |

In an erase operation, all of the memory cells of the two-cell unit structures 500, 502, 504 are erased via an −FN erasing operation. The following table shows representative operating voltages for gate injection erase of all of the memory cells of the two-cell unit structures 500, 502, 504.

Example Operating Voltages for Erase Operation

| $V_{WL-412}$ | −20 V |
|---|---|
| $V_{WL-415}$ | −20 V |
| $V_{WL-418}$ | −20 V |
| $V_{WL-411}$ | −20 V |
| $V_{WL-414}$ | −20 V |
| $V_{WL-417}$ | −20 V |
| $V_{SEL}$ | 3 V |
| $V_{SC}$ | 3 V |
| $V_{SP}$ | 0 V |
| $V_{BL}$ | 0 V |

Figure 6:
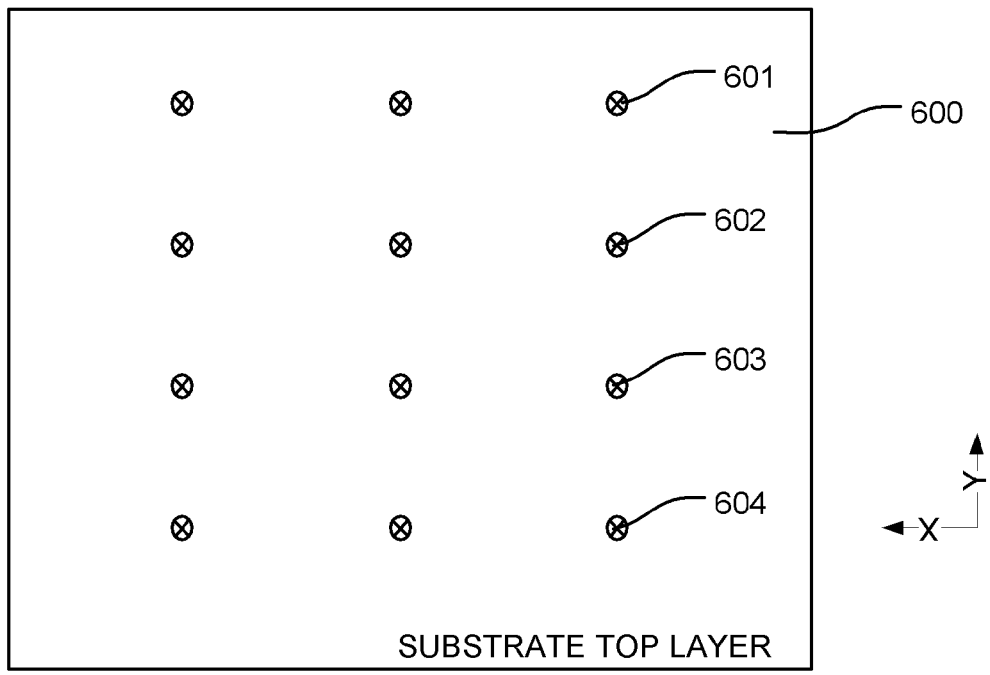
FIGS. 6-11 show a sequence of stages of a manufacturing process for making the 3D memory structure described herein.

FIGS. 6-11 illustrate stages in a process for manufacturing a memory cube as discussed above. In FIG. 6, a surface 600 of an integrated circuit substrate is illustrated with an array of contacts for connection to the 3D structure. The array of contacts includes a first set of contacts, including contacts 601-604 which are coupled to individual access devices, and adapted for connection to the semiconductor pillars in the 3D structure. The individual access devices can be formed in the substrate, and may include for example MOS transistors having gates coupled to select lines arranged to the X-direction, sources coupled to the bit lines arranged to the Y-direction, and drains connected to the contacts (e.g. 201-204). The individual access devices are selected by biasing the select lines and bit lines as appropriate for the particular operation.

Figure 7:
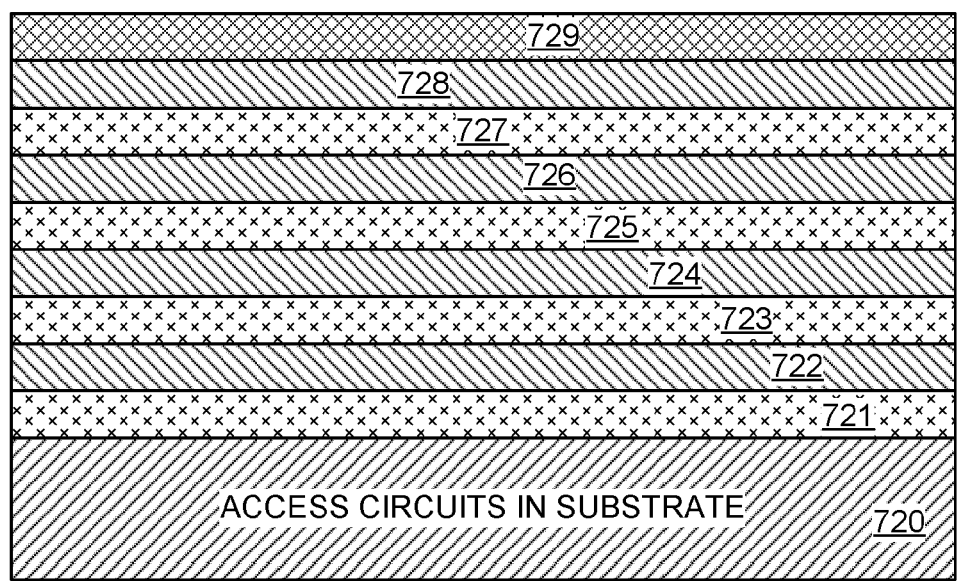

FIG. 7 is a side cross-section showing a multilayer stack of materials at a first stage in the manufacturing process, after forming alternating layers 721, 723, 725, 727 of insulating material, such as silicon dioxide or silicon nitride, and layers 722, 724, 726, 728 of word line material, such as n+-polysilicon, on top of the substrate 220. In a representative structure, the thicknesses of the alternating layers of insulating material can be about 50 nanometers, and the thicknesses of the alternating layers of word line material can be about 50 nanometers. Over the top of the alternating layers, a layer 729 of hard mask material, such as silicon nitride, can be formed.

Figure 8:
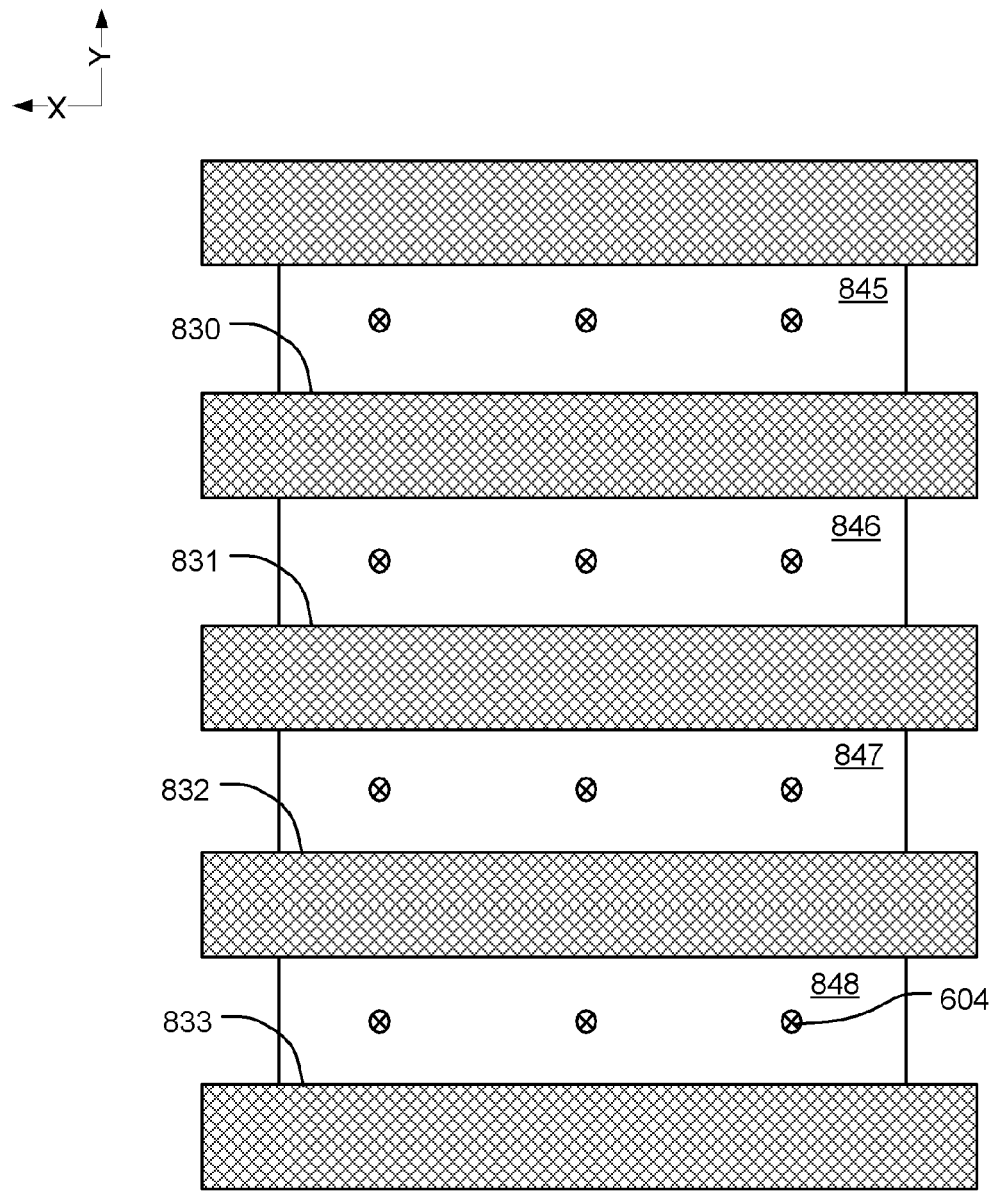

FIG. 8 is a layout view from a perspective over layer 729 showing the results using a first lithographic process to define a pattern for the trenches, and a patterned etch of the stack to form trenches 845-848 through the multilayer stack of materials shown in FIG. 7, exposing contacts, such as contact 604, coupled to individual access devices in the body line access circuits. Anisotropic reactive ion etching techniques can be used to etch through the polysilicon and silicon oxide or silicon nitride layers, with a high aspect ratio. The trenches have sidewalls 830-833 on which the layers of word line material are exposed at each level of the structure. The widths of the trenches 845-848 in a representative structure can be about 50 nanometers.

Figure 9:
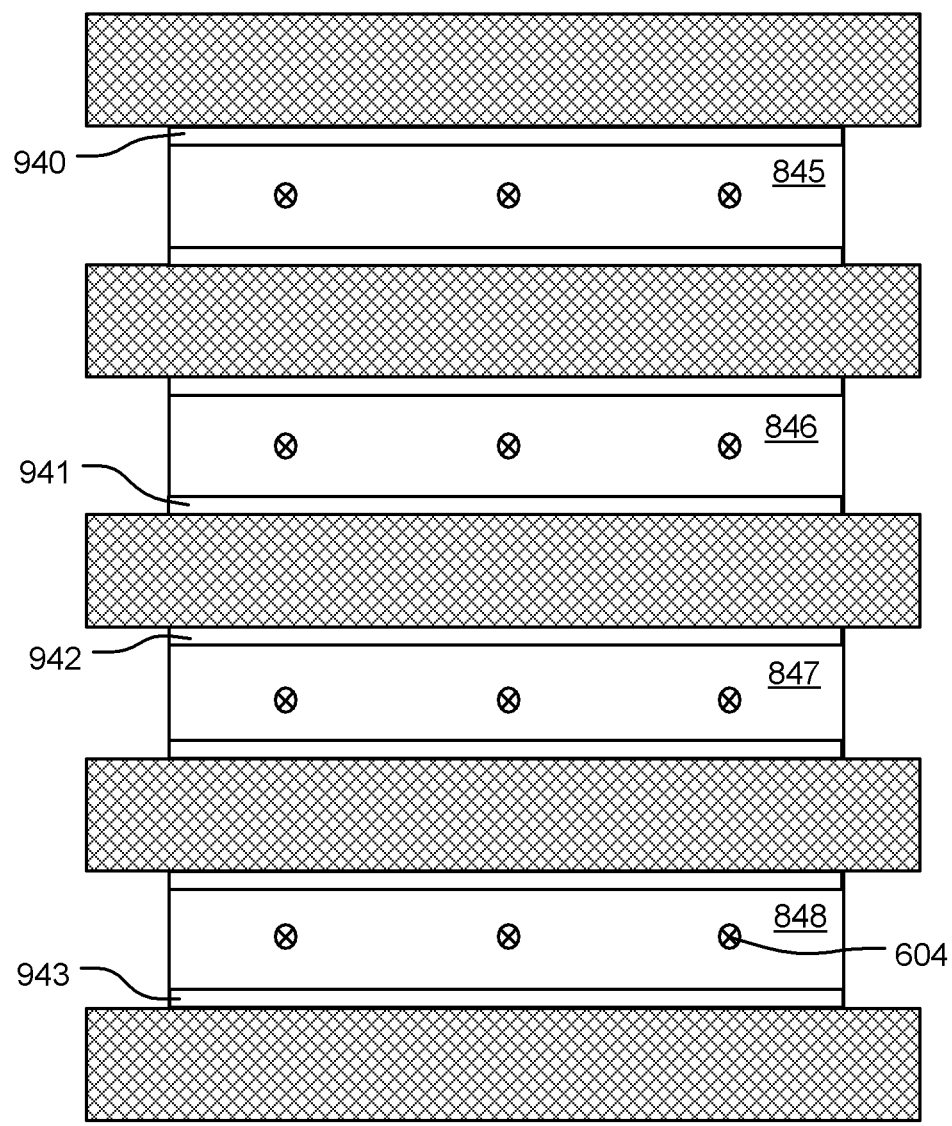

FIG. 9 shows a later stage in the process after deposition of the multilayer charge trapping structures (940-943) over and on the sidewalls of the trenches (845-848) contacting the layers of word line material. A representative structure and process is described below with reference to FIG. 16. After deposition of the multilayer charge trapping structures, the process includes depositing a thin protective layer, such as p-type polysilicon over the multilayer charge trapping structures, and etching the resulting formation using an anisotropic process to remove the material of the multilayer charge trapping structures (940-943) from the bottom of the trenches, 845-848, and exposing the contacts (e.g. 604).

The charge trapping structures 940-943 include a tunneling layer in contact with the word line material, the charge trapping layer over the tunneling layer, and a blocking layer over the charge trapping layer, such as used in typical charge trapping memory devices. For example, the tunneling layer may comprise a layer of silicon dioxide or silicon oxide nitride, a charge trapping layer may comprise a layer of silicon nitride or other charge trapping material, and the blocking layer may comprise a layer of silicon dioxide or a high-κ material typical in SONOS type memory devices. In alternatives, as explained below with reference to FIG. 16, a bandgap engineered charge trapping structure can be utilized.

Figure 10:
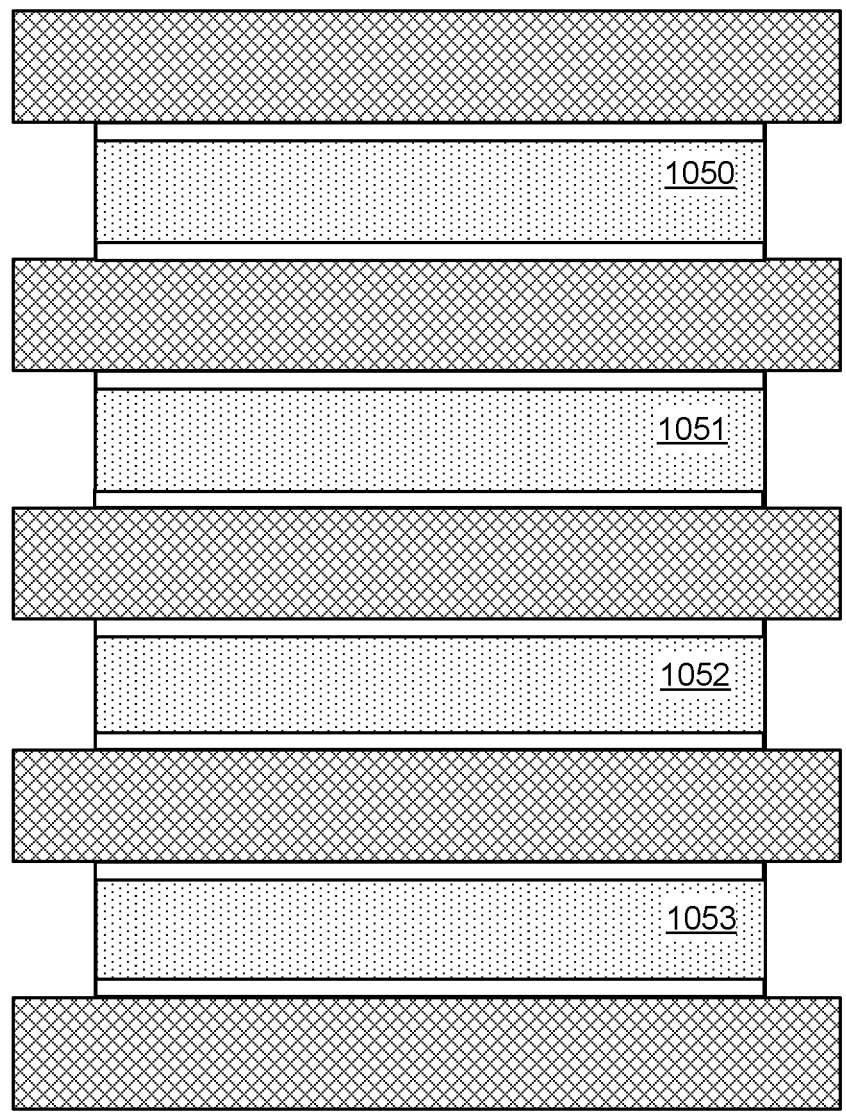

FIG. 10 shows a next stage in the process after filling the trenches with the material to be used for the semiconductor pillars, such as p-type polysilicon, to form filled trenches 250-253. The semiconductor material contacts the blocking layers of the charge trapping structures 940-943.

Figure 11:
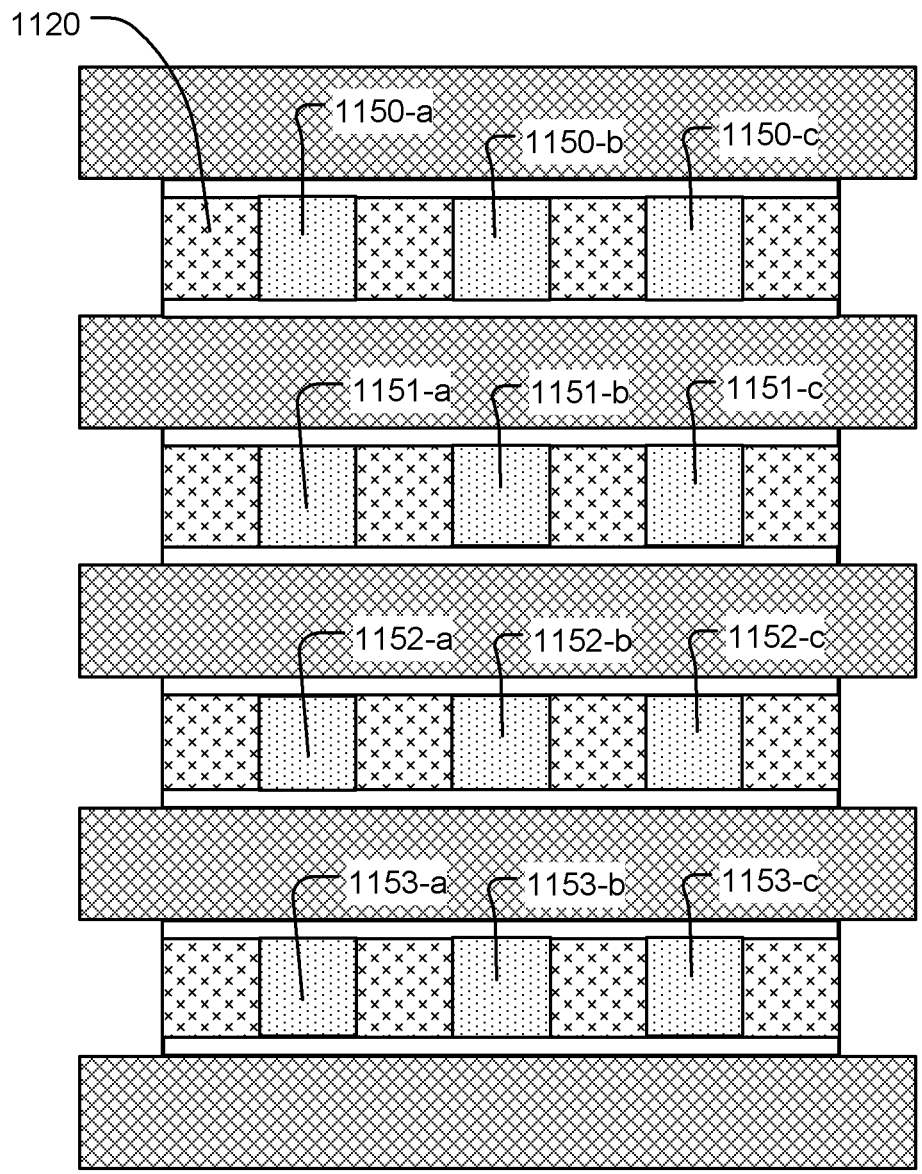

FIG. 11 shows the result of using a second lithographic process to define a pattern for the semiconductor pillars. A patterned etch of the filled trenches is applied using an anisotropic etch process that is selective for the material of the semiconductor pillars, to define the semiconductor pillars (1150-a, 1150-b, 1150-c, 1151-a, 1151-b, 1151-c, 1152-a, 1152-b, 1152-c, 1153-a, 1153-b, 1153-c) contacting the contacts, including contact 604 (not shown) to the underlying individual access devices, and to create vertical openings between the semiconductor pillars. Next, dielectric insulating material, such as silicon dioxide, is filled in between the pillars to form insulator columns (e.g. insulator 1120) between the semiconductor pillars.

The bottom set of source plane select transistors 148, including the common conductive plane 133, and the source plane 147 are then formed on the top of the structure, arranged as discussed above for connection to the top ends of the semiconductor pillars. The top set of source plane select transistors 198 are then formed over the source plane 133, and the process for manufacturing a memory cube as discussed above with respect to FIGS. 6-11 can then be repeated to form a second memory cube.

Figure 12:
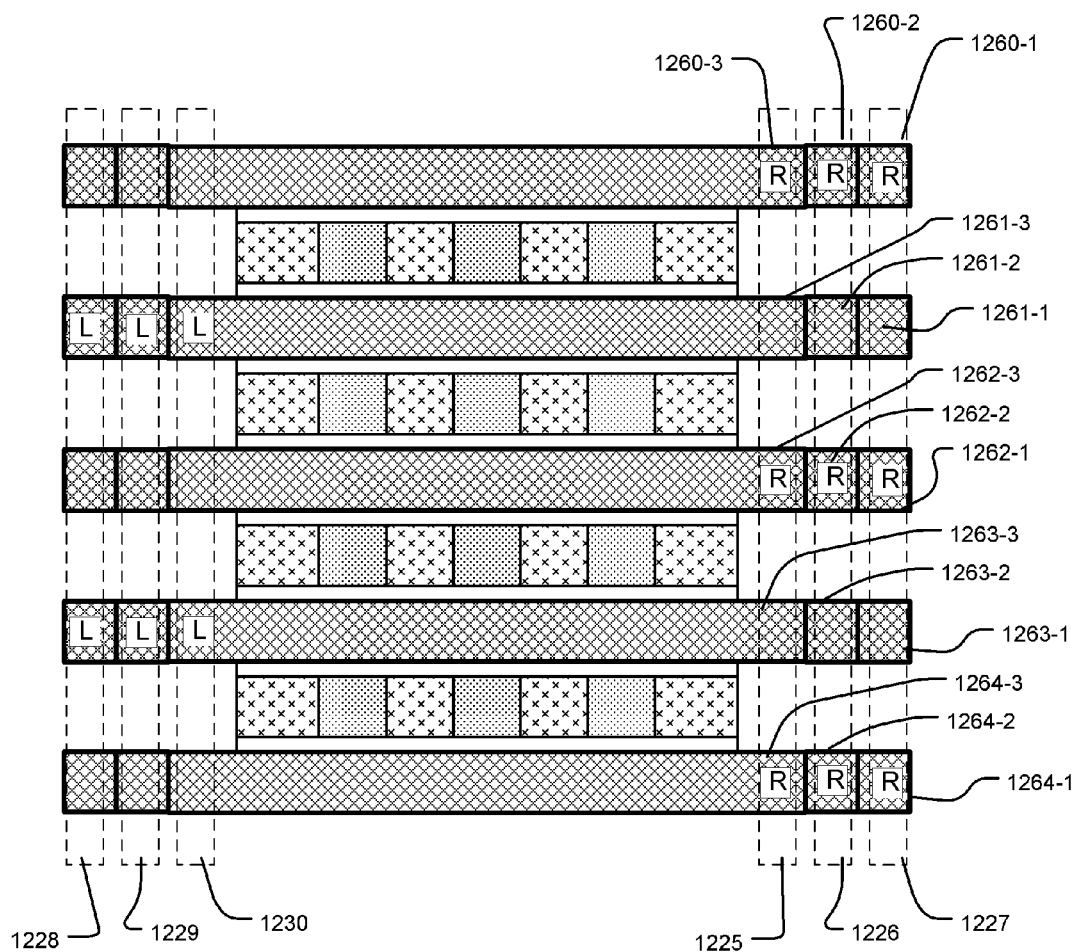

FIG. 12 illustrates a top view of a configuration for making contact the left side and right side word lines in the plurality of levels. The left side word lines 1261-1, 1261-2, 1261-3 and 1263-1, 1263-2, 1263-3 and right side word lines 1262-1, 1262-2, 1262-3 and 1264-1, 1264-2, and 1264-3 in each layer have landing areas (labeled "L" or "R") arranged in a stair-step pattern (or other pattern) so that the landing areas in each level are not overlaid by any of the left side and right side word lines in the overlying levels. Contact plugs or other conductive lines (not shown) extend through the plurality of levels and contact the landing areas. An overlying patterned connection layer includes left side connectors 1228, 1229, 1230 and right side connectors 1225, 1226, 1227 over the plurality of patterned layers and in contact with the conductive lines contacting the landing areas of left and right sides conductors. The left and right side connectors are routed to left and right plane decoding circuits (not shown).

Figure 13:
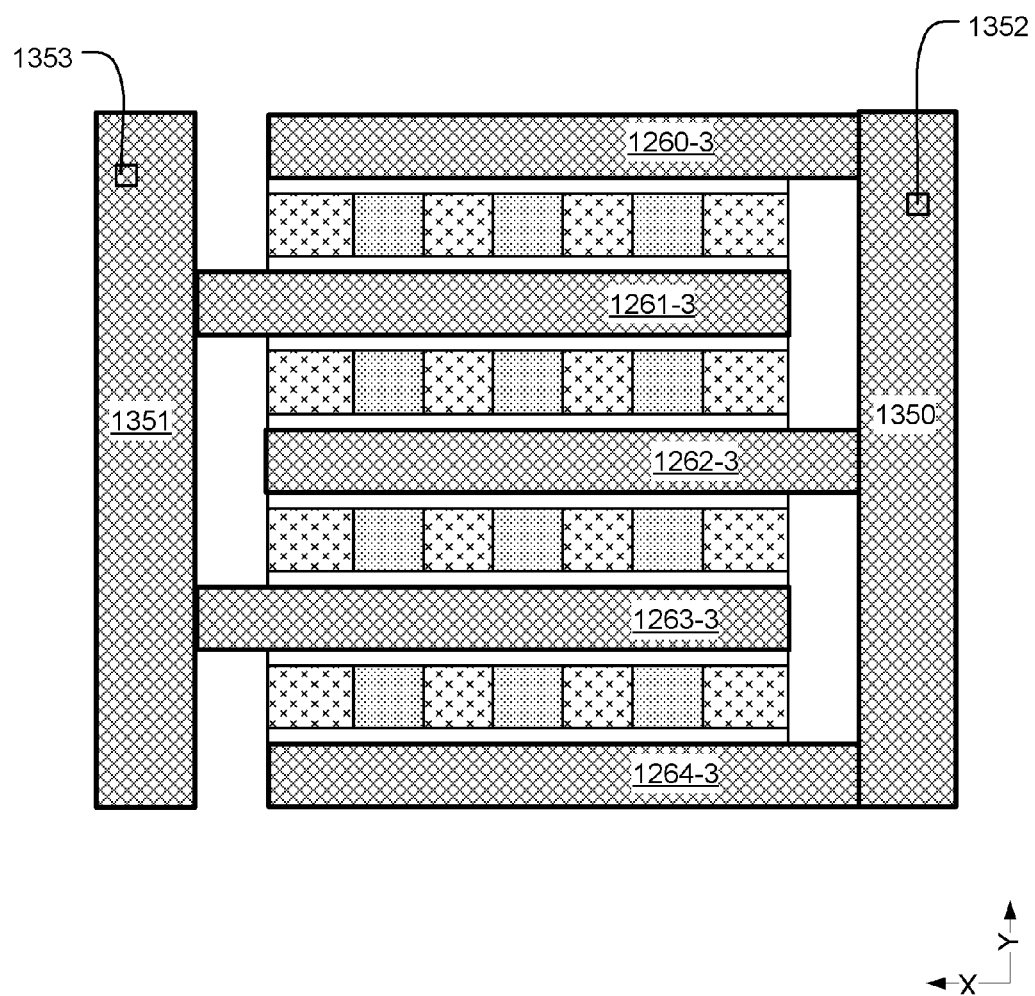

FIG. 13 is a layout view of a level in an alternative embodiment, showing left side word lines 1261-3, 1263-3 and right side word lines 1260-3, 1262-3, 1264-3 from the top level of the structure in FIG. 12 and with extensions 1350, 1351 for connection of the left side and right side word lines to the left and right plane decoders. The reference numerals used in FIG. 12 are repeated in FIG. 13 where appropriate. As can be seen, the left side word lines 1261-3, 1263-3 are coupled to an extension 1351 which is adapted for connection to a contact plug on a landing area 1353, through which connection to a decoder circuit on the integrated circuit substrate can be made. Likewise, right side word lines 1260-3, 1262-3, 1264-3 are coupled to an extension 1350 which is adapted for connection to a contact plug on landing area 1352, through which connection to a decoder circuit on the integrated circuit substrate can be made.

FIG. 14 is a cross-sectional view of the interconnect structure taken through word lines 1260-1, 1260-2, 1260-3 of FIG. 12, where conductors 1480-1, 1480-2, and 1480-3 extend through vias to landing areas on the right side word lines 1260-1, 1260-2, 1260-3 in respective levels. The conductors 1480-1, 1480-2, 1480-3 are used in this example for coupling the levels to interconnect lines (e.g. line 1485) in a wiring layer, such as a patterned metallization layer for connection to decoding or bias circuits.

The landing areas are portions of patterned word lines 1260-1, 1260-2, 1260-3 used for contact with conductors 1480-1, 1480-2, 1480-3. The sizes of the landing areas are large enough to provide room for the conductors 1480-1, 1480-2, 1480-3 to adequately couple the word lines 1260-1, 1260-2, 1260-3 on the various levels to the overlying interconnect lines (e.g. 1485), as well as to address issues such as alignment tolerances.

The size of a landing area thus depends on a number of factors, including the size and number of conductors used, and will vary from embodiment to embodiment.

For the purpose of this description, the direction in which the word lines 1260-1 to 1260-3 extend is referred to herein as the "longitudinal" direction. The "transverse" direction is perpendicular to the longitudinal direction, and is into and out of the cross-section illustrated in FIG. 14. Both the longitudinal and transverse directions are considered to be "lateral dimensions," meaning a direction that is in a 2-dimensional area of a plan view of the word lines 1260-1 to 1260-3 on the various levels. The "length" of structures or features is its length in the longitudinal direction, and its "width" is its width in the transverse direction.

Word line 1260-1 is the lowest level in the plurality of levels. The word line 1260-1 includes landing area 1461-1. The word line 1260-2 includes landing area 1461-2. The word line 1260-3 includes landing area 1461-3.

In FIG. 14, the right side word line 1260-1 includes landing area 1461-1 on the right end. Left side word lines, such as word line 1261-1 in FIG. 12, include landing areas on the left end. In some alternative embodiments additional landing areas may be defined, such as a landing area on the opposite end of the word line. This structure can be made using a first mask to define a longitudinal opening over the left side and right side word lines, and a second mask to define an opening over a landing area to the lowest layer through all the overlying layers, etching the opening, and then trimming the mask to define a next opening, etching the opening, and trimming the mask and so on until openings to all the layers are formed, and landing areas are created in a stair-step configuration, that are aligned on the conductor lines, and that are not overlaid by conductor lines on any overlying layer. A more detailed description of a process for manufacturing this structure is shown in my co-pending U.S. patent application entitled 3D INTEGRATED CIRCUIT LAYER INTERCONNECT, application Ser. No. 12/579,192, filed 14 Oct. 2009, which is incorporated by reference as if fully set forth herein.

Figure 15A:
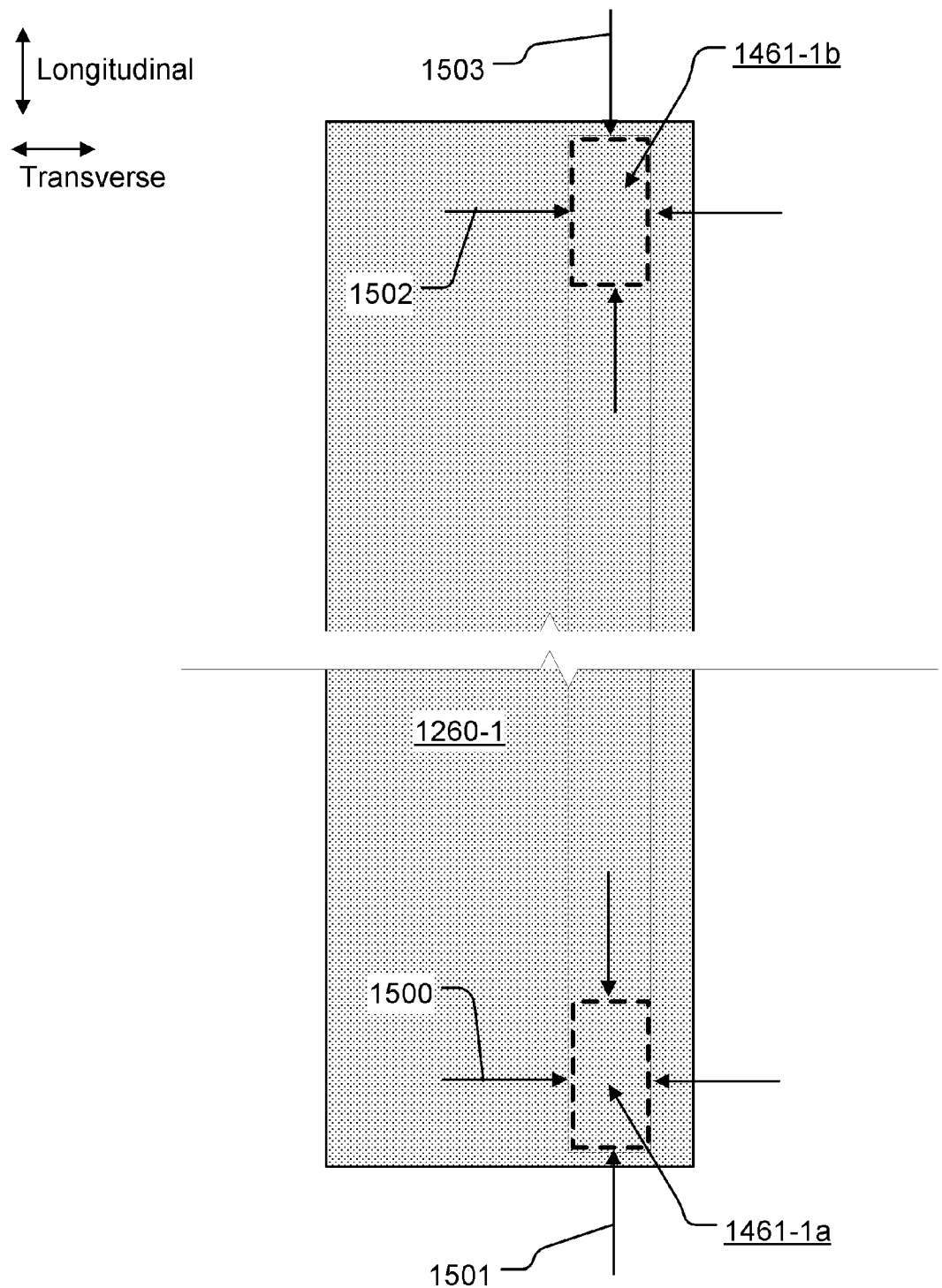

FIG. 15A is a plan view of a portion of word line 1260-1, including the landing areas 1461-1a, 1461-1b, one on each end of the word line, so that all the left side and right side conductors can be formed in the same process. The width of the word line 1260-1 in this drawing is exaggerated for the purpose of clarity in the figure. As shown in FIG. 15A, landing area 1461-1a has a width 1500 in the transverse direction and a length 1501 in the longitudinal direction. Landing area 1461-1b has a width 1502 in the transverse direction and a length 1503 in the longitudinal direction. In the embodiment of FIG. 15A the landing areas 1461-1a, 1461-1b each have a rectangular cross-section. In embodiments, the landing areas 1461-1a, 1461-1b may each have a cross-section that is circular, elliptical, square, rectangular, or somewhat irregularly shaped.

Because word line 1260-1 is in the lowest level, the vertical conductors (like conductors 1480-1, 1480-2, 1480-3 in FIG. 14) in the vias need not pass through the word line 1260-1 to underlying levels. Thus, in this example conductor line 1260-1 does not have openings.

Figure 15B:
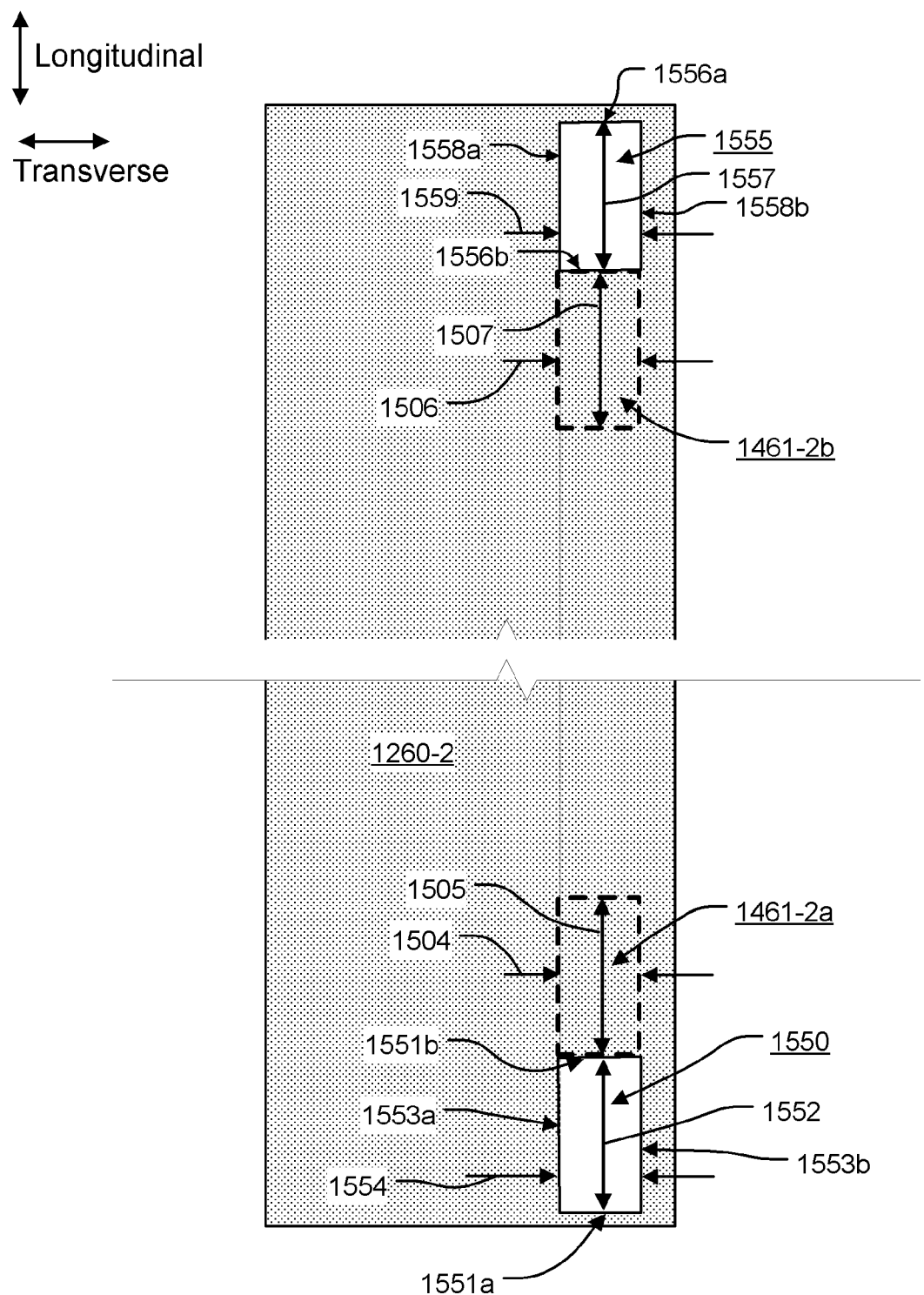

FIG. 15B is a plan view of word line 1260-2. As illustrated in FIG. 14, word line 1260-2 overlies word line 1260-1. Word line 1260-2 includes an opening 1550 overlying the landing area 1461-1a on word line 1260-1. The opening 1550 has a distal longitudinal sidewall 1551a and a proximal longitudinal sidewall 1551b defining the length 1552 of the opening 1550. The length 1552 of the opening 1550 is at least as large as the length 1505 of the underlying landing area 1461-1a, so that the conductor 1480-1 for the landing area 1461-1a can pass through the word line 1260-2.

The word line 1260-2 also includes opening 1555 overlying the landing area 1461-1b. The opening 1555 has distal and proximal longitudinal sidewalls 1556a, 1556b defining the length 1557 of the opening 1555. The length 1557 of the opening 1555 is at least as large as the length 1507 of the underlying landing area 1461-1b, so that the conductors for the landing area 1461-1b can pass through the word line 1260-2.

The word line 1260-2 also includes first and second landing areas 1461-2a, 1461-2b adjacent the openings 1550, 1555 respectively. The first and second landing areas 1461-2a, 1461-2b are the portions of word line 1260-2 used for contact with the vertical conductors.

Figure 15C:
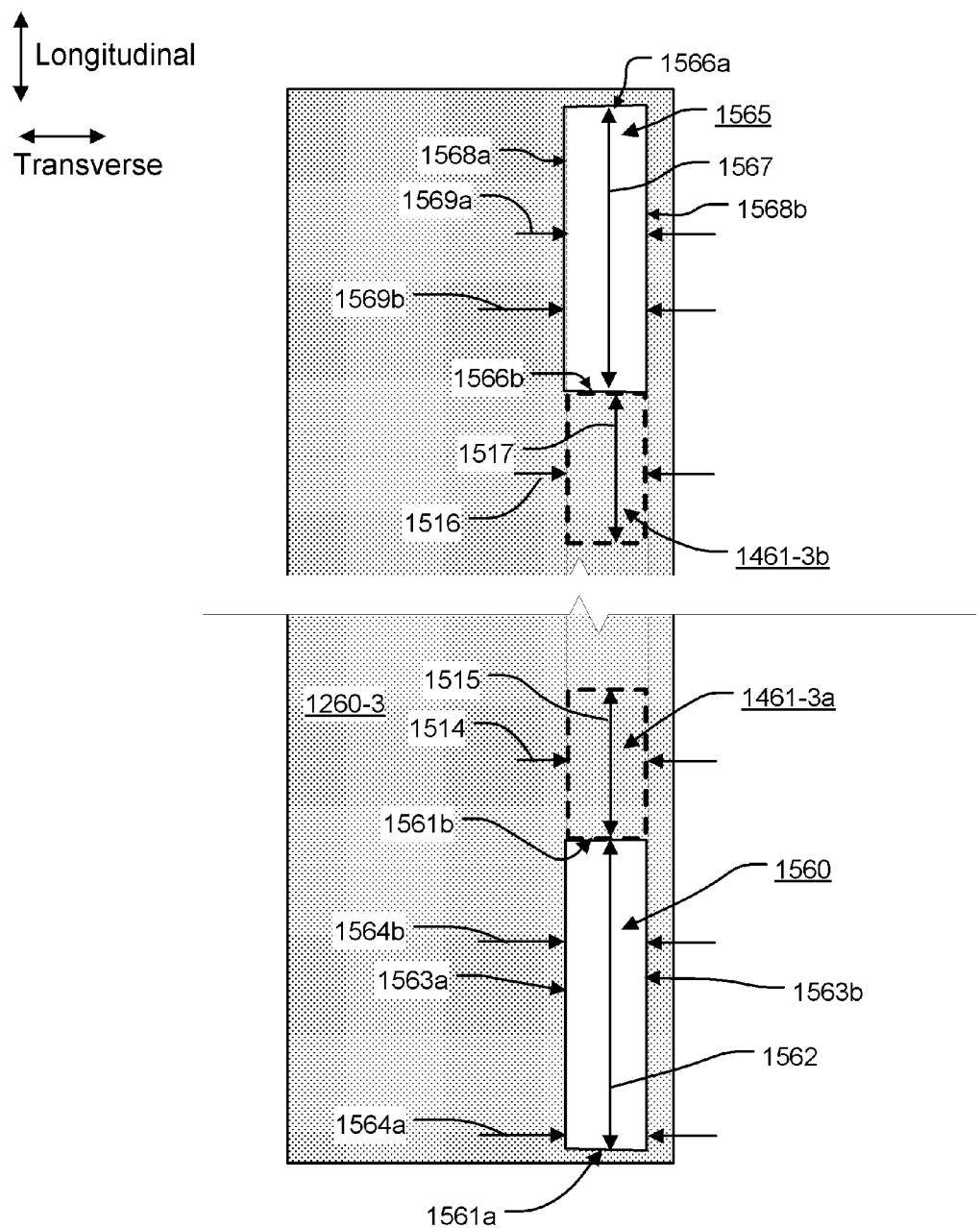

FIG. 15C is a plan view of a portion of word line 1260-3, including the first and second landing areas 1461-3a, 1461-3b and the openings 1560, 1565 within the interconnect structure. As shown in FIG. 14C, word line 1260-3 includes an opening 1560, which is arranged to overlie landing area 1461-1a on word line 1260-1 and landing area 1461-2a on word line 1260-2. The opening 1560 has distal and proximal longitudinal sidewalls 1561a, 1561b defining the length 1562 of the opening 1560. The length 1562 of the opening 1560 is at least as large as the sum of the lengths 1501 and 1505 of the underlying landing areas 1461-1a and 1461-2a, so that the conductors 1480 for the landing areas 1461-1a and 1461-2a can pass through the word line 1260-3.

The distal longitudinal sidewall 1561*a* of opening 1560 is vertically aligned with the distal longitudinal sidewall 1551*a* of the underlying opening 1550. As mentioned above, the openings can be formed using the opening in a single etch mask and one additional mask formed over the opening in the single etch mask, as well as processes for etching the additional mask without a critical alignment step, resulting in the formation of openings having distal longitudinal sidewalls (1561*a*, 1551*a*, . . . ) along the perimeter of the single etch mask that are vertically aligned.

The word line 1260-3 also includes opening 1565 overlying the landing area 1461-1*b* on conductor line 1260-1 and landing area 1461-2*b* on word line 1260-2. The opening 1565 has outside and inside longitudinal sidewalls 1566*a*, 1566*b* defining the length 1567 of the opening 1565. The outside longitudinal sidewall 1566*a* of opening 1565 is vertically aligned with the outside longitudinal sidewall 1556*a* of the underlying opening 1555.

The length 1567 of the opening 1565 is at least as large as the sum of the lengths of the underlying landing areas and openings, so that the conductors 1480 for the landing areas can pass through.

The word line 1260-3 also includes first and second landing areas 1461-3*a*, 1461-3*b* adjacent the openings 1560, 1565 respectively. The first and second landing areas 1461-3*a*, 1461-3*b* are the portions of word line 1260-3 used for contact with the conductors 1480. As shown in FIG. 15C, landing area 1461-3*a* is adjacent the opening 1560 and has a width 1514 in the transverse direction and a length 1515 in the longitudinal direction. Landing area 1461-3*b* is adjacent the opening 1565 having a width 1516 in the transverse direction and a length 1517 in the longitudinal direction.

In the illustrated embodiment, the openings in the various word lines 1260-1 to 1260-3 have substantially the same width in the transverse direction. Alternatively, the width of the openings can vary along the longitudinal direction, for example in a step-like manner, in order to accommodate landing areas having different widths.

In the cross-section of FIG. 12, the openings within the interconnect structure result in the levels having a staircase-like pattern on both ends. That is, the two openings in each level are symmetrical about an axis perpendicular to both the longitudinal and transverse directions, and the two landing areas of each level are also symmetrical about that axis. As used herein, the term "symmetrical" is intended to accommodate manufacturing tolerances in the formation of the openings using the opening in a single etch mask and multiple etch processes which may cause variations in the dimensions of the openings.

In alternative embodiments in which each level includes a single opening and a single landing area, the levels have a staircase-like pattern on only one side.

Figure 16:
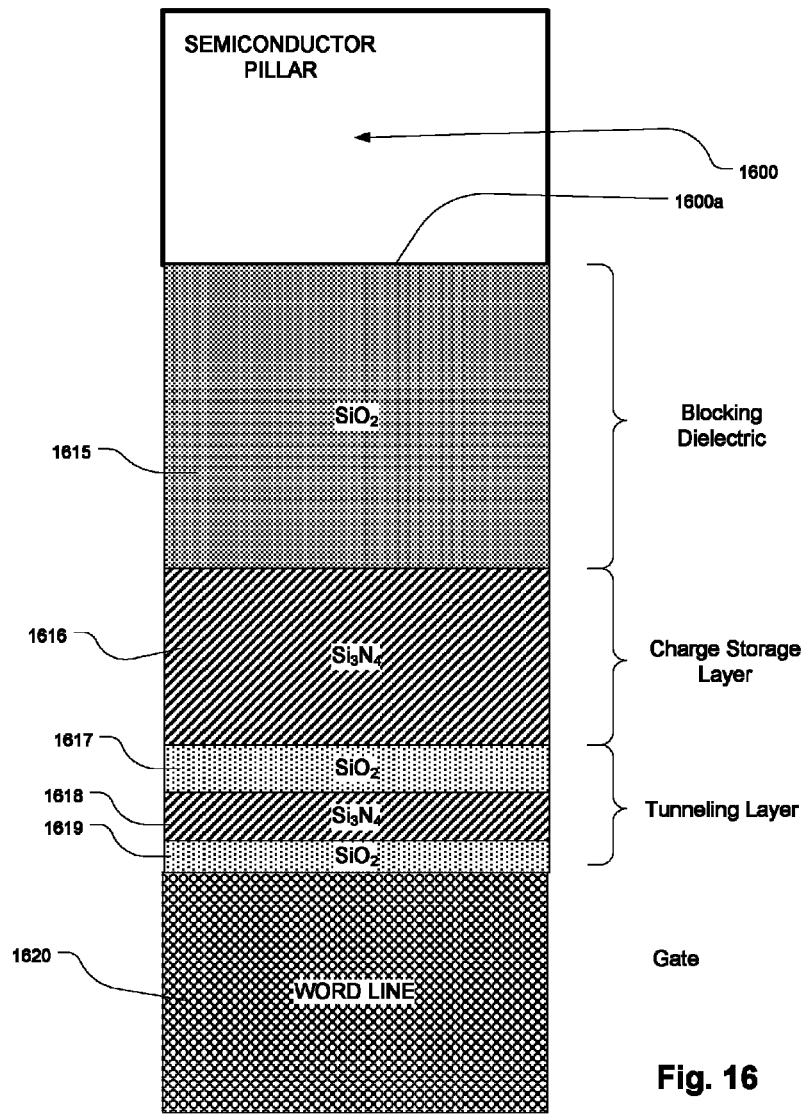
FIG. 16 illustrates a BE-SONOS charge storage structure utilized in an embodiment of the 3D memory structure described herein.

FIG. 16 is a simplified diagram of a charge storage structure suitable for use in the memory cells described herein, employing a bandgap engineered dielectric tunneling layer (BE-SONOS-type). The memory cell includes a channel surface 1600*a* in a semiconductor pillar 1600. Not shown in FIG. 16 are the dielectric insulators separating the pillars.

A gate 1620 in this embodiment comprises n+ polysilicon. P+ polysilicon may also be used. Other embodiments employ metals, metal compounds or combinations of metals and metal compounds for the gate 1620, such as platinum, tantalum nitride, metal silicides, aluminum or other metal or metal compound gate materials. For some applications, it is preferable to use materials having work functions higher than 4.5 eV. A variety of high work function materials suitable for use as a gate terminal are described in U.S. Pat. No. 6,912,163. Such materials are typically deposited using sputtering and physical vapor deposition technologies, and can be patterned using reactive ion etching.

In the embodiment illustrated in FIG. 16, the dielectric tunneling layer on the gate side comprises a composite of materials, including a first layer 1619, referred to as a hole tunneling layer, of silicon dioxide on the surface of the gate 1620 formed for example using in-situ steam generation ISSG with optional nitridation by either a post deposition NO anneal or by addition of NO to the ambient during deposition. The thickness of the first layer 1619 of silicon dioxide is less than 2 nm, and preferably 1.5 nm or less.

A second layer 1618, referred to as a band offset layer, of silicon nitride lies on the first layer 1619 of silicon oxide formed for example using low-pressure chemical vapor deposition LPCVD, using for example dichlorosilane DCS and NH3 precursors at 680° C. In alternative processes, the band offset layer comprises silicon oxynitride, made using a similar process with an N2O precursor. The thickness of the layer 1618 of silicon nitride is less than 3 nm, and preferably 2.5 nm or less.

A third layer 1617 of silicon dioxide, referred to as an isolation layer, lies on the layer 1618 of silicon nitride formed for example using LPCVD high temperature oxide HTO deposition. The layer 1617 may also be implemented using silicon oxynitride, or other suitable material having a relatively large bandgap. The thickness of the layer 1617 is less than 4 nm, and preferably 3.5 nm or less.

A charge trapping layer 1616 in this embodiment comprises silicon nitride having a thickness greater than 5 nm, including for example about 7 nm in this embodiment formed for example using LPCVD. Other charge trapping materials and structures may be employed, including for example silicon oxynitride ($Si_xO_yN_z$), silicon-rich nitride, silicon-rich oxide, trapping layers including embedded nano-particles and so on.

A blocking dielectric layer 1615 in this embodiment comprises silicon oxide, which can be formed by wet conversion from the nitride by a wet furnace oxidation process. Other embodiments may be implemented using high temperature oxide (HTO) or LPCVD SiO2. The thickness of layer 1615 of silicon oxide can be for example in the range of about 5 to 8 nanometers, while the thickness of the layer 1616 of silicon nitride can be for example in the range of 5 to 7 nanometers. The layer 1615 of silicon oxide in one example is about 7 nm. Alternatively, other materials such as high-κ metal oxides like aluminum oxide, hafnium oxide and so on, or combinations of materials, can be used for the blocking dielectric layer 415.

In a representative embodiment, the first layer 1619 can be 1.3 nm of silicon dioxide; the band offset layer 1618 can be 2 nm of silicon nitride; the isolation layer 1617 can be 2.5 nm of silicon dioxide; the charge trapping layer 1616 can be 7 nm of silicon nitride; and the blocking dielectric layer 1615 can be 7 nm of silicon oxide. The gate material can be p+ polysilicon.

The stack of layers 1619-1617 of FIG. 16 under a low electric field, has a "U-shaped" conduction band and an "inverted U-shaped" valence band. The dielectric tunneling layer described herein therefore is characterized by band offset characteristics, include a relatively large hole tunneling barrier height in a thin region (first layer 1619) at the interface with the semiconductor body, and an increase in valence band energy level at a first offset less than 2 nm from the channel surface. The band offset characteristics also include a decrease in valence band energy level at a second offset (second layer 1618) from the channel by providing a thin layer of relatively high tunneling barrier height material (third layer 1617), resulting in the inverted U-shaped valence band shape. Likewise, the conduction band has a U-shape caused by the same selection of materials.

The valence band energy level at the first location is such that an electric field sufficient to induce hole tunneling through the thin region between the interface with the semiconductor body and the first location, is also sufficient to raise the valence band energy level after the first location to a level that effectively eliminates the hole tunneling barrier in the composite tunneling dielectric after the first location. This structure enables electric field assisted hole tunneling at high speeds while effectively preventing charge leakage through the composite tunneling dielectric in the absence of electric fields or in the presence of smaller electric fields induced for the purpose of other operations, such as reading data from the cell or programming adjacent cells.

Figure 17:
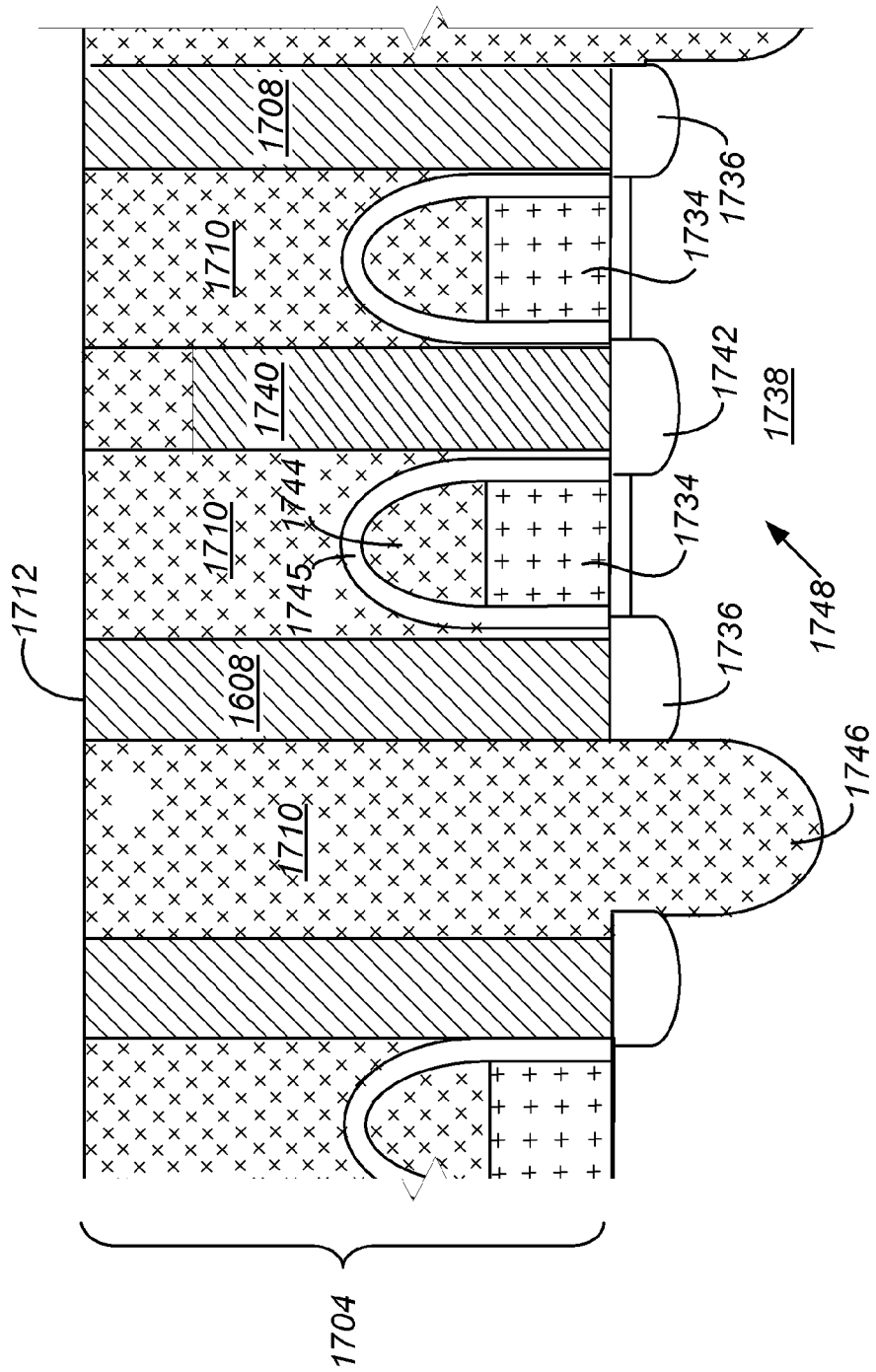
FIG. 17 illustrates an implementation for an array of access devices suitable for use as the bottom set of pillar select transistors.

FIG. 17 shows one example implementation for an array of access devices suitable for use as the bottom set of pillar select transistors 106 shown in FIG. 1. As shown in FIG. 17, an access layer 1704 is implemented in a substrate including insulating material 1710, having a top surface with an array of contacts (e.g. contact 1712) exposed thereon. The contacts for individual pillars are provided at top surfaces of drain contacts 1708, which are coupled to the drain terminals of MOS transistors in the access layer 1704. The access layer 1704 includes a semiconductor body having source regions 1742 and drain regions 1736 therein. Polysilicon select lines 1734 are provided over dielectric layers and between the source regions 1742 and drain regions 1736. In the embodiment shown, the source regions 1742 are shared by adjacent MOS transistors, making two-transistor structures 1748. Source contacts 1740 are positioned between word lines 1734 and contact source regions 1742 within substrate 1738. The source contacts 1740 can be connected to bit lines (not shown) in a metal layer, which run perpendicular to the word lines and between the columns of drain contacts 1708. Select lines 1734 are covered by silicide caps 1744. Select lines 1734 and caps 1744 are covered by a dielectric layer 1745. Isolation trenches 1746 separate the two-transistor structures 1748 from the adjacent two-transistor structures. In this example transistors act as the access devices. Individual pillars can be coupled to the contacts 1712, and selected individually by controlling the biasing of the source contacts 1740 and the word lines 1734. Of course other structures may be used to implement the access device array, including for example, vertical MOS device arrays.

Figure 18:
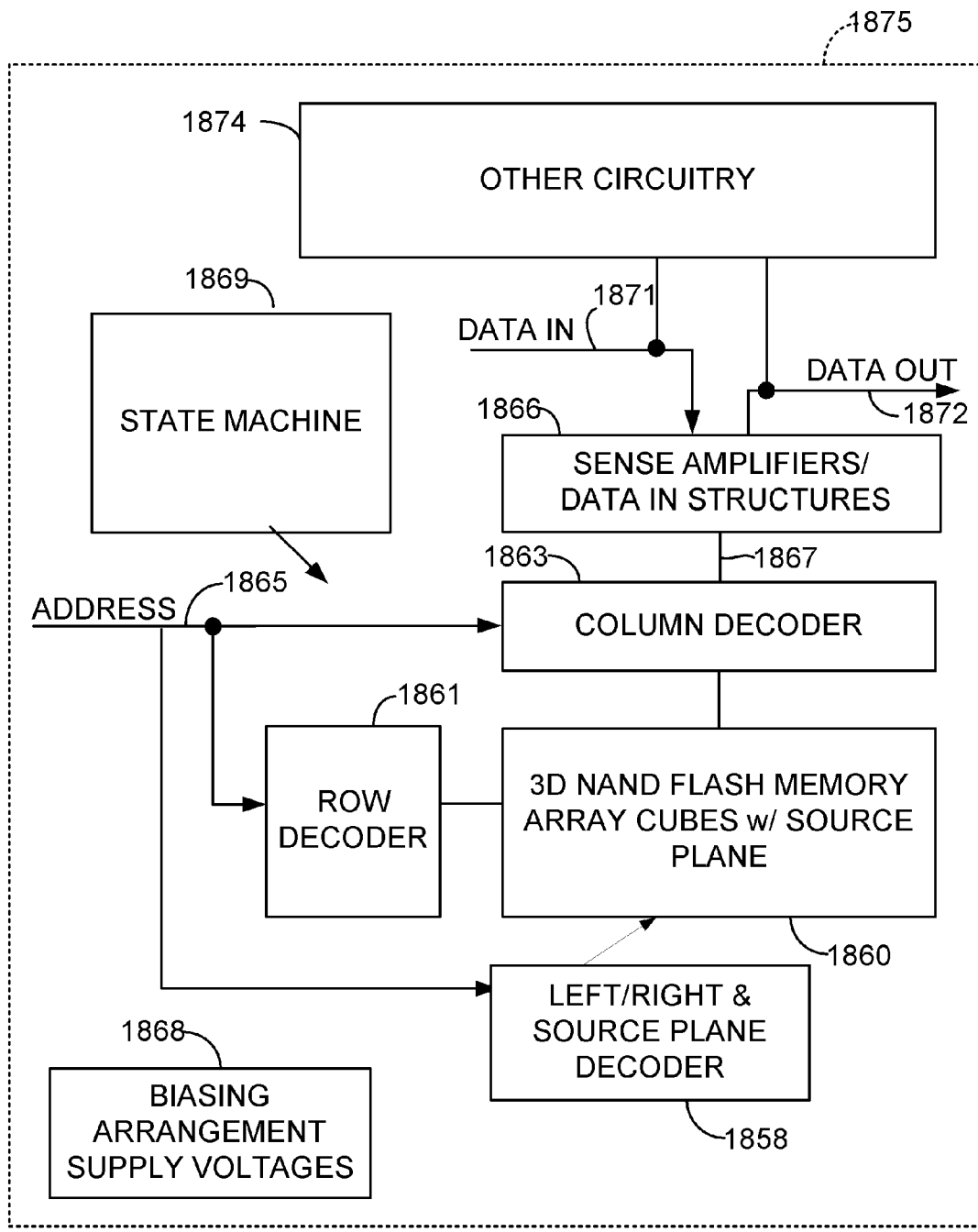
FIG. 18 is a simplified block diagram of an integrated circuit including a 3D NAND-type charge trapping memory array as described herein.

FIG. 18 is a simplified block diagram of an integrated circuit 1875 according to an embodiment of the present invention. The integrated circuit 1875 including a 3D NAND flash memory array 1860 with a source plane, implemented as described herein, on a semiconductor substrate. Addresses are supplied on bus 1865 to column decoder 1863, row decoder 1861 and left/right plane and source plane decoders 1858. Arrays of access devices for individual pillars underlie and overlie the array 1860, and are coupled to the row decoder 1861 and the column decoder 1863, for array embodiments like that shown in FIG. 1. Sense amplifiers and data-in structures in block 1866 are coupled to the array in this example via data bus 1867. Data is supplied via the data-in line 1871 from input/output ports on the integrated circuit 1875 or from other data sources internal or external to the integrated circuit 1875, to the data-in structures in block 1866. In the illustrated embodiment, other circuitry 1874 is included on the integrated circuit, such as a general purpose processor or special purpose application circuitry, or a combination of modules providing system-on-a-chip functionality supported by the memory cell array. Data is supplied via the data-out line 1872 from the sense amplifiers in block 1866 to input/output ports on the integrated circuit 1875, or to other data destinations internal or external to the integrated circuit 1875.

A controller implemented in this example using bias arrangement state machine 1869 controls the application of bias arrangement supply voltages generated or provided through the voltage supply or supplies in block 1868, such as read, erase, program, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Three-dimensional stacking is an efficient way to reduce the cost per bit for semiconductor memory, particularly when physical limitations in the size of the memory elements is reached for a given plane. Prior art technology addressed to 3D arrays requires several critical lithography steps to make minimum feature size elements in each stack layer. Also, driver transistors used for the memory array multiplied in number by the number of planes.

Technology described here includes a high density 3D array in which only one critical layer lithography step is required to pattern all the layers of a memory cube. The memory via and layer interconnect via patterning steps shared by each layer in a memory cube. Also, the layers can share the word line and bit line decoders to reduce the area penalty of prior art multilevel structures. Also, a unique two-cell unit structure is described for charge trapping memory in which independently addressable data sites are provided on each of two sides of a semiconductor pillar. An array of access devices is used to select individual semiconductor pillars. Left and right word lines are used to select individual cells on selected levels, and common conductive planes are used to select individual memory cubes.

Figure 19:
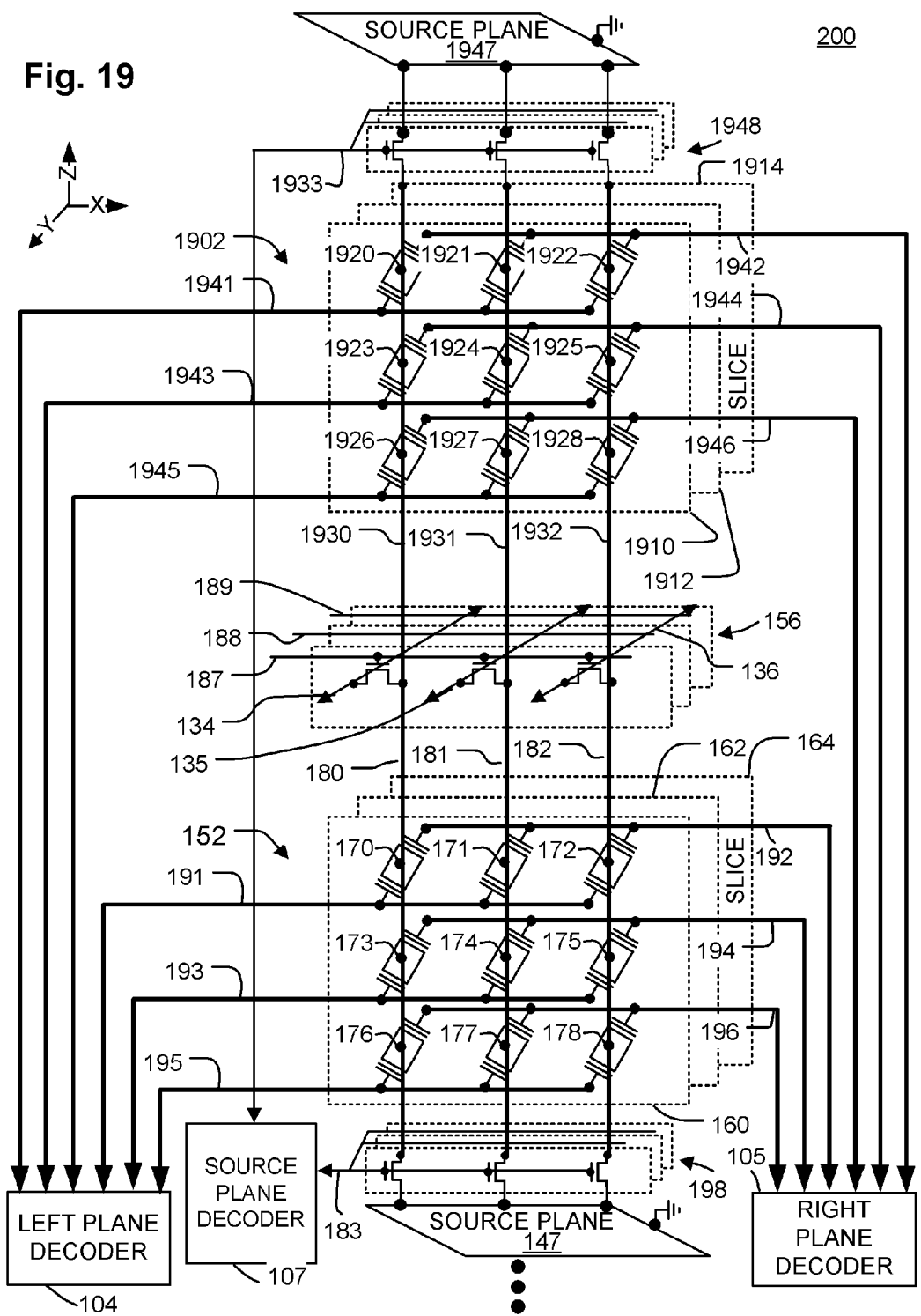
FIG. 19 is a schematic diagram of a second embodiment of a 3D memory device as described herein.

FIG. 19 illustrates a schematic diagram of a second embodiment of the 3D memory device 200 which includes a third memory cube 1902 overlying the structure illustrated in FIG. 1.

The third memory cube 1902 includes slices 1910, 1912, 1914 which lie in X-Z planes. In the illustrated schematic, there are nine two-cell unit structures 1920-1928 in slice 1910. The third memory cube 1902 shares the top set of pillar select transistors 156 with the memory cube 152, including the bit lines 134, 135, 136 and select lines 187, 188, 189. Semiconductor pillars 1930, 1931, 1932 couple the two-cell unit structures 1920-1928 in a Z-direction column to the top set of pillar select transistors 156.

The left gates on the two-cell unit structures in a particular level in all of the slices 1910, 1912, 1914 are coupled via a word line element 1941, 1943, 1945 to the left plane decoder 104. Likewise, the right gates on the two-cell unit structures in a particular level in all of the slices 1910, 1912, 1914 are coupled via a word line element 1942, 1944, 1945 to the right plane decoder 105.

Top ends of the array of semiconductor pillars of the two-cell unit structures 1920-1928 in a Z-direction column are coupled via a corresponding select transistor in a set of source plane select transistors 1948 to a source plane 1947. The source plane 147 is a layer of conductive material overlying the memory cube 1902. In the illustrated example, the source plane 1947 is coupled to a ground terminal. Alternatively, the source plane 1947 may be coupled to a voltage source for applying a voltage other than ground.

The gates of the access devices in the set of source plane select transistors 1948 are all coupled via common conductive plane 1933 to a driver selected by source plane decoder 107.

In some embodiments, the 3D memory device 200 may include one or more sets of select transistors between the top set of pillar select transistors 156 and the pillars in the third memory cube 1902 and/or the pillars in the memory cube 152.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
   a plurality of bit lines over a substrate;
   a plurality of memory cells over the plurality of bit lines, wherein at least one memory cell of the plurality of memory cells is over another one memory cell of the plurality of memory cells;
   a source plane over the plurality of memory cells;
   bottom and top memory cubes including respective arrays of semiconductor pillars, a given semiconductor pillar in each array of semiconductor pillars including a plurality of dielectric charge trapping structures in a NAND string along a side of the given semiconductor pillar, and word lines orthogonal to the semiconductor pillars and adjacent the charge trapping structures of the semiconductor pillars, the bottom memory cube including said plurality of memory cells, the dielectric charge trapping structures in the plurality of dielectric charge trapping structures including a tunneling layer adjacent a corresponding word line in said word lines, and a dielectric charge trapping layer between the tunneling layer and a blocking layer, the blocking layer between the dielectric charge trapping layer and the given semiconductor pillar;
   the source plane being between the bottom and top memory cubes, the source plane selectively coupled to top ends of each of the semiconductor pillars of the bottom memory cube by a bottom set of source plane select transistors, and selectively coupled to bottom ends of each of the semiconductor body pillars of the top memory cube by a top set of source plane select transistors;
   a bottom set of pillar select transistors to selectively couple bottom ends of the semiconductor pillars of the bottom memory cube to corresponding bit lines in said plurality of bit lines; and
   a top set of pillar select transistors to selectively couple top ends of the semiconductor pillars of the top memory cube to corresponding bit lines in a plurality of top bit lines.

2. The memory device of claim 1, wherein the given semiconductor pillar in each array of semiconductor pillars comprises a plurality of two-cell unit structures, the two-cell unit structures of the given semiconductor pillar including a first dielectric charge trapping structure along a first side of the given semiconductor pillar, and a second dielectric charge trapping structure along a second opposing side of the given semiconductor pillar, such that the first charge trapping structures in the two-cell unit structures of the given semiconductor pillar are arranged in a first NAND string, and the second charge trapping structures in the two-cell unit structures of the given semiconductor pillar are arranged in a second NAND string.

3. The memory device of claim 1, wherein said word lines include a plurality of pairs of word lines arranged orthogonal to one of the arrays of semiconductor pillars, a given pair of word lines including:
   a first set of word lines commonly coupled to one another and adjacent the first dielectric charge trapping structures between alternating rows of semiconductor pillars in said one of the arrays of semiconductor pillars; and
   a second set of word lines commonly coupled to one another and interleaved with the word lines in the first set of word lines, the second set of word lines adjacent the second dielectric charge trapping structures between interleaved alternative rows of semiconductor pillars.

4. The memory device of claim 1, further comprising a controller to program and erase selected memory cells by biasing corresponding semiconductor pillars and corresponding word lines to induce Fowler-Nordheim tunneling from the word lines through the tunneling layer to the dielectric charge trapping structures.

5. The memory device of claim 1, including decoder circuitry, the decoder circuitry including:
   a row decoder coupled to the first mentioned plurality of bit lines and to the top bit lines and arranged to access individual rows of semiconductor pillars;
   a column decoder coupled to the bottom and top sets of pillar select transistors and arranged to access individual columns of semiconductor pillars;
   a source plane decoder coupled to the bottom and top sets of source plane select transistors and arranged to access one of the bottom and top memory cubes; and
   a fifth decoder coupled to the word lines, and arranged to drive word lines on selected levels in the semiconductor pillars.

6. The memory device of claim 1, further comprising a third memory cube overlying the top memory cube, the top set of pillar select transistors and the plurality of top bit lines, the third memory cube including a third array of semiconductor pillars including a plurality of dielectric charge trapping structures arranged in NAND strings, and word lines orthogonal to the semiconductor pillars in the third array of semiconductor pillars, and wherein:
   the top set of pillar select transistors selectively couple bottom ends of the semiconductor pillars of the third memory cube to corresponding bit lines in the plurality of top bit lines.

7. A memory device, comprising:
   a plurality of bit lines over a substrate;
   a plurality of memory cells over the plurality of bit lines, wherein at least one memory cell of the plurality of memory cells is over another one memory cell of the plurality of memory cells, the plurality of memory cells disposed in arrays of semiconductor pillars including rows and columns;
   bottom and top memory cubes including the respective arrays of semiconductor pillars, a given semiconductor pillar in each array of semiconductor pillars including a plurality of dielectric charge trapping structures in a NAND string along a side of the given semiconductor pillar, a given semiconductor pillar in the arrays of semiconductor pillars including a plurality of dielectric charge trapping structures in a NAND string along a side of the given semiconductor pillar, and word lines orthogonal to the semiconductor pillars and adjacent the charge trapping structures of the semiconductor pillars, the top memory cube including said plurality of memory cells, the bottom memory cube including said plurality of memory cells, the dielectric charge trapping structures in the plurality of dielectric charge trapping structures including a tunneling layer adjacent a corresponding word line in said word lines, and a dielectric charge trapping layer between the tunneling layer and a blocking layer, the blocking layer between the dielectric charge trapping layer and the given semiconductor pillar;
a source plane over the array of semiconductor pillars, the source plane overlying the top memory cube, the source plane selectively coupled to top ends of the semiconductor pillars of the top memory cube by a top set of source plane select transistors;
a bottom source plane underlying the bottom memory cube, the bottom source plane selectively coupled to bottom ends of the semiconductor pillars of the bottom memory cube by a bottom set of source plane select transistors; and
a set of shared pillar select transistors to selectively couple top ends of the semiconductor pillars of the bottom memory cube and bottom ends of the semiconductor pillars of the top memory cube to corresponding bit lines in the plurality of bit lines.

8. A memory device, comprising:
a first set of select transistors;
a first 3D array of memory cells, the first 3D array including memory cells disposed in a first array of semiconductor pillars coupled to the first set of select transistors;
a common source coupled to the first 3D array of memory cells;
a second 3D array of memory cells, the second 3D array including memory cells disposed in a second array of semiconductor pillars coupled to the common source, wherein the common source is between the first and second 3D arrays of memory cells, the memory cells disposed in the first and second arrays of semiconductor pillars formed by a dielectric charge trapping structure of a plurality of dielectric charge trapping structures in a NAND string along a side of the given semiconductor pillar, and word lines orthogonal to the semiconductor pillars and adjacent the charge trapping structures of the semiconductor pillars, the dielectric charge trapping structures in the plurality of dielectric charge trapping structures including a tunneling layer adjacent a corresponding word line in said word lines, and a dielectric charge trapping layer between the tunneling layer and a blocking layer, the blocking layer between the dielectric charge trapping layer and the given semiconductor pillar; and
a second set of select transistors coupled to the second 3D array of memory cells, wherein the common source comprises a conductor that is coupled in common to a selected one of the first and second arrays of semiconductor pillars.

9. The memory device of claim 8, wherein the first and second sets of select transistors are outside of the first and second arrays of semiconductor pillars.

10. The memory device of claim 8, wherein the first 3D array of memory cells is disposed in an array of semiconductor pillars, and the first set of select transistors is formed outside of the array of semiconductor pillars.

11. The memory device of claim 8, wherein the first 3D array of memory cells is disposed in an array of semiconductor pillars, and the memory cells disposed in the array of semiconductor pillars include charge storage structures that are separated from charge storage structures of adjacent memory cells disposed in the same semiconductor pillar in the array of semiconductor pillars.

12. The memory device of claim 8, comprising a set of pillar source select transistors, coupled to at least one of the first and second arrays of semiconductor pillars, controlled by a common conductor to couple ends of at least one of the first and second arrays of semiconductor pillars in common to the source plane.

13. A memory device, comprising:
a plurality of bit lines over a substrate;
a plurality of memory cells over the plurality of bit lines disposed in a plurality of semiconductor pillars, wherein at least one memory cell of the plurality of memory cells is disposed in a particular semiconductor pillar over another one memory cell of the plurality of memory cells, the memory cells including dielectric charge trapping structures, the dielectric charge trapping structures including a tunneling layer adjacent a corresponding word line in a plurality of word lines, and a dielectric charge trapping layer between the tunneling layer and a blocking layer, the blocking layer between the dielectric charge trapping layer and a semiconductor pillar of a plurality of semiconductor pillars;
a plurality of pillar select transistors, the plurality of pillar select transistors coupling the plurality of bit lines to the plurality of semiconductor pillars; and
a source plane over the plurality of memory cells.

* * * * *